United States Patent
Ito et al.

(10) Patent No.: US 9,559,129 B2
(45) Date of Patent: Jan. 31, 2017

(54) SEMICONDUCTOR DEVICE HAVING ANTENNA AND METHOD FOR MANUFACTURING THEREOF

(75) Inventors: Kyosuke Ito, Hadano (JP); Junya Maruyama, Ebina (JP); Takuya Tsurume, Tochigi (JP); Shunpei Yamazaki, Setagaya (JP)

(73) Assignee: SEMICONDUCTOR ENERGY LABORATORY CO., LTD., Kanagawa-ken (JP)

( * ) Notice: Subject to any disclaimer, the term of this patent is extended or adjusted under 35 U.S.C. 154(b) by 0 days.

(21) Appl. No.: 13/468,354

(22) Filed: May 10, 2012

(65) Prior Publication Data

US 2012/0241924 A1   Sep. 27, 2012

Related U.S. Application Data

(62) Division of application No. 11/665,548, filed as application No. PCT/JP2005/019448 on Oct. 18, 2005, now Pat. No. 8,178,958.

(30) Foreign Application Priority Data

Oct. 19, 2004 (JP) ................................ 2004-304856

(51) Int. Cl.
*H01L 27/13* (2006.01)
*G06K 19/077* (2006.01)
(Continued)

(52) U.S. Cl.
CPC ......... *H01L 27/13* (2013.01); *G06K 19/07749* (2013.01); *H01Q 1/2225* (2013.01);
(Continued)

(58) Field of Classification Search
CPC ............... G06K 19/077; H01L 27/1023; H01L 27/1214; H01L 27/1266; H01B 1/22; H05K 3/102; H05K 3/107
(Continued)

(56) References Cited

U.S. PATENT DOCUMENTS 4,614,837 A * 9/1986 Kane ..................... H05K 3/102
                                                        174/257
5,234,717 A   8/1993 Matsuno et al.
(Continued)

FOREIGN PATENT DOCUMENTS

EP        1 427 055 A    6/2004
JP        2000-113146    4/2000
(Continued)

OTHER PUBLICATIONS

Korean Office Action (Application No. 2007-7010497) dated Nov. 17, 2011.
(Continued)

*Primary Examiner* — Jerome Jackson, Jr.
*Assistant Examiner* — Fang-Xing Jiang
(74) *Attorney, Agent, or Firm* — Robinson Intellectual Property Law Office; Eric J. Robinson

(57) ABSTRACT

The present invention provides an antenna in that the adhesive intensity of a conductive body formed on a base film is increased, and a semiconductor device including the antenna. The invention further provides a semiconductor device with high reliability that is formed by attaching an element formation layer and an antenna, wherein the element formation layer is not damaged due to a structure of the antenna. The semiconductor device includes the element formation layer provided over a substrate and the antenna provided over the element formation layer. The element formation layer and the antenna are electrically connected.
(Continued)

The antenna has a base film and a conductive body, wherein at least a part of the conductive body is embedded in the base film. As a method for embedding the conductive body in the base film, a depression is formed in the base film and the conductive body is formed therein.

6 Claims, 16 Drawing Sheets

(51) Int. Cl.
  *H01Q 1/22* (2006.01)
  *H01Q 7/00* (2006.01)
  *H01L 27/12* (2006.01)
(52) U.S. Cl.
  CPC ........... *H01Q 7/00* (2013.01); *H01L 27/1214* (2013.01); *H01L 27/1266* (2013.01); *Y10T 29/49018* (2015.01)
(58) Field of Classification Search
  USPC .......... 257/40, 679, 72; 340/572.8; 438/149; 439/85; 235/488, 492; 174/68.5
  See application file for complete search history.

(56) References Cited

U.S. PATENT DOCUMENTS

| | | | |
|---|---|---|---|
| 5,259,926 A | 11/1993 | Kuwabara et al. | |
| 6,814,832 B2 | 11/2004 | Utsunomiya | |
| 6,849,936 B1 | 2/2005 | Berman et al. | |
| 6,870,516 B2 | 3/2005 | Aisenbrey | |
| 2002/0016028 A1* | 2/2002 | Arao et al. | 438/149 |
| 2002/0109634 A1 | 8/2002 | Aisenbrey | |
| 2002/0139682 A1* | 10/2002 | Basol et al. | 205/117 |
| 2002/0152606 A1 | 10/2002 | Huang | |
| 2003/0008133 A1* | 1/2003 | Paik | H01B 1/22 428/332 |
| 2003/0029921 A1* | 2/2003 | Akita et al. | 235/492 |
| 2003/0085454 A1* | 5/2003 | Reutner et al. | 257/679 |
| 2003/0143452 A1 | 7/2003 | Ito et al. | |
| 2004/0125029 A1 | 7/2004 | Maoz et al. | |
| 2004/0164302 A1* | 8/2004 | Arai et al. | 257/72 |
| 2004/0262793 A1 | 12/2004 | Mizushima et al. | |
| 2005/0006482 A1* | 1/2005 | Kano et al. | 235/488 |
| 2005/0130389 A1 | 6/2005 | Yamazaki et al. | |
| 2005/0134463 A1* | 6/2005 | Yamazaki | 340/572.8 |
| 2005/0148121 A1* | 7/2005 | Yamazaki et al. | 438/149 |
| 2005/0287846 A1* | 12/2005 | Dozen et al. | 439/85 |
| 2007/0161159 A1 | 7/2007 | Yamazaki et al. | |
| 2008/0164464 A1* | 7/2008 | Kato | 257/40 |
| 2010/0270057 A1* | 10/2010 | Yanagimoto | H05K 3/107 174/250 |

FOREIGN PATENT DOCUMENTS

| | | |
|---|---|---|
| JP | 2001-260580 | 9/2001 |
| JP | 2001-312709 | 11/2001 |
| JP | 2003-142666 A | 5/2003 |
| JP | 2004-236289 | 8/2004 |
| JP | 2005-252242 | 9/2005 |
| WO | WO 2005/076358 | 8/2005 |

OTHER PUBLICATIONS

Karibe Hiroshi, "14. How to Make Coils for Non-contact IC Card," Very easy book for Non-contact IC Card, Oct. 30, 2003,. p. 40-41, The Nikkan Kogyo Shimbun.

* cited by examiner

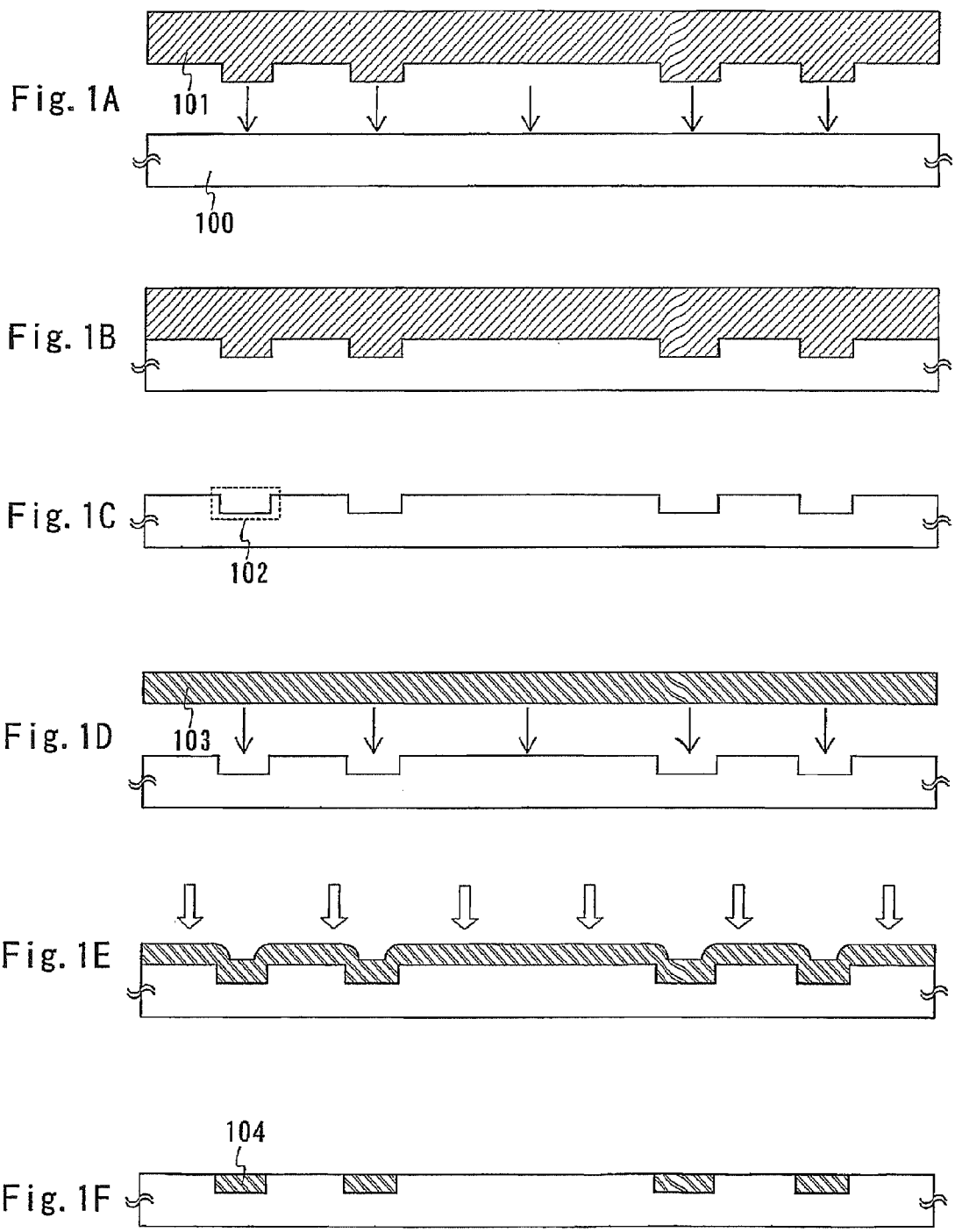

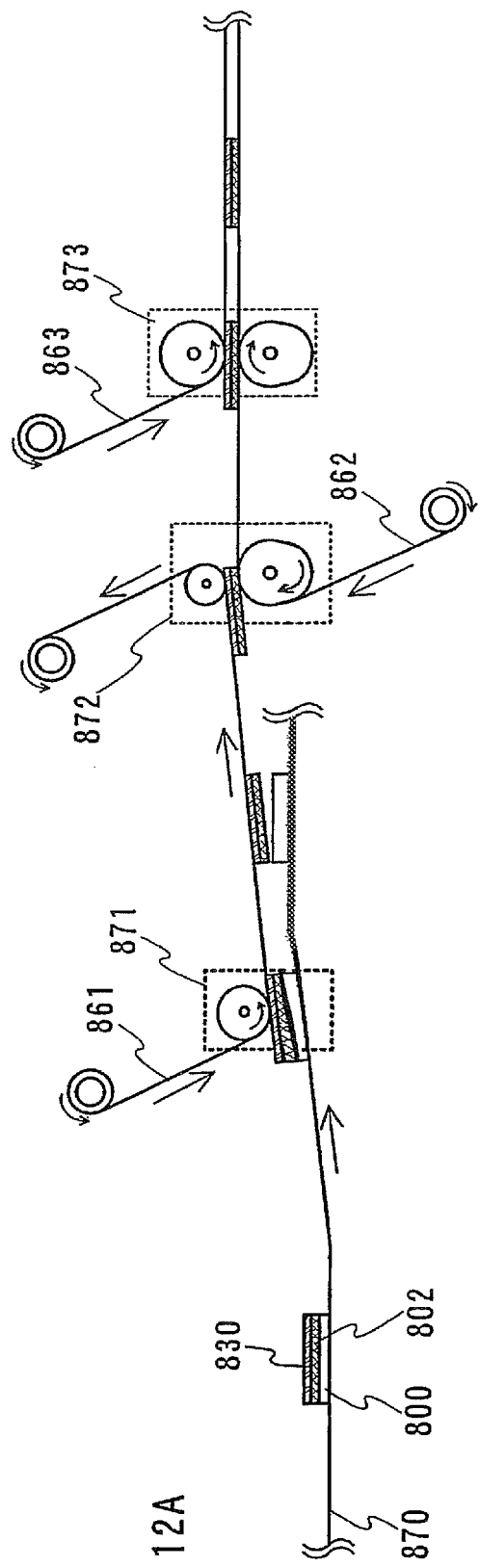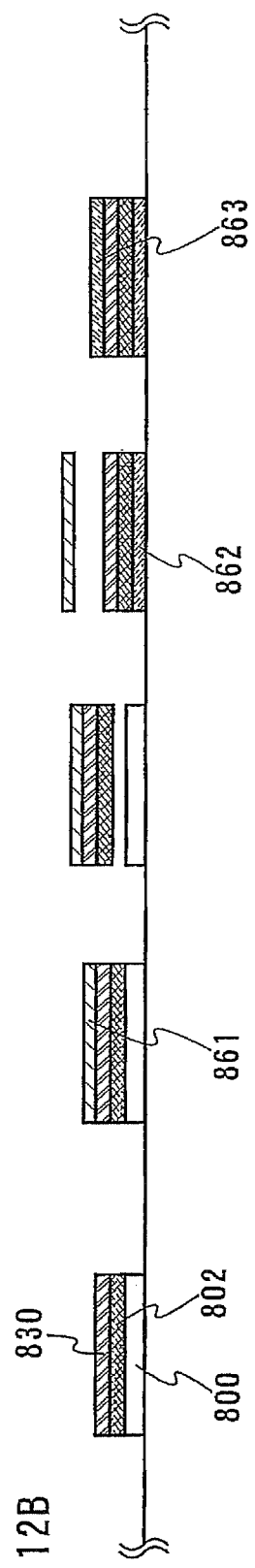
Fig. 12A
Fig. 12B

SEMICONDUCTOR DEVICE HAVING ANTENNA AND METHOD FOR MANUFACTURING THEREOF

TECHNICAL FIELD

The present invention relates to a structure of an antenna and a method for manufacturing thereof. Moreover, the present invention relates to a semiconductor device including the antenna and a method for manufacturing thereof.

BACKGROUND ART

In recent years, an object recognition technology has been attracting attention. In this object recognition technology, a history of an object is clarified by assigning an ID (identification) number to the object and performing non-contact communication using a semiconductor device equipped with an antenna. This is useful for production and management of the object. As the semiconductor device, in particular, a wireless chip (also referred to as an ID tag, an IC tag, an IC chip, an RF (radio frequency) tag, a wireless tag, an electronic tag, an RFID (radio frequency identification) and the like) have been introduced in businesses, markets and the like on a trial basis.

DISCLOSURE OF INVENTION

An object of the present invention is to provide an antenna in which the bond strength of a conductive body formed over a base film (also referred to as a film or a substrate) is improved, and a semiconductor device having the antenna. Another object of the invention is to provide a semiconductor device with high reliability, wherein when the semiconductor device is formed by bonding an element formation layer and an antenna, the element formation layer is not damaged due to a structure of the antenna. Also, still another object of the invention is to provide a method for manufacturing the antenna and a method for manufacturing the semiconductor device.

To solve the above problems, the present invention takes the following countermeasures.

In an aspect of the present invention, a semiconductor device includes an element formation layer provided over a substrate and an antenna provided over the element formation layer. The antenna includes a film and a conductive body. The element formation and the conductive body are electrically connected to each other, and at least a part of the conductive body is embedded in the film.

In another aspect of the invention, a semiconductor device includes an element formation layer provided over a substrate, and an antenna provided over the element formation layer. The antenna includes a film and a conductive body. The element formation layer and the conductive body are electrically connected to each other. The surface of the film has a depression and the conductive body is provided in the depression. The conductive body is not necessary to be entirely embedded in the depression of the film, and at least a part of the conductive body may be embedded in the depression of the film. Further, the depression indicates a hollow. The depression provided on the surface of the film indicates that the surface of the film is partly depressed.

In another aspect of the invention, a semiconductor device includes an element formation layer provided over a substrate and an antenna provided over the element formation layer. The antenna includes a film and a conductive body. The element formation layer and the conductive body are electrically connected to each other. The surface of the film has a depression. The conductive body is provided on the surface and in the depression of the film. The conductive body provided on the surface and in the depression of the film is electrically connected.

In the structure of the above semiconductor device, the element formation layer and the antenna can be electrically connected to each other through a connection terminal. Also, a flexible substrate can be used as the substrate over which the element formation layer is provided.

In another aspect of the invention, an antenna includes a film and a conductive body. A surface of the film has a depression. The conductive body is provided on the surface and in the depression of the film, and the conductive body provided on the surface and in the depression of the film is electrically connected. Further, the conductive body is not necessary to be entirely embedded in the depression, and at least a part of the conductive body may be embedded in the depression of the film.

In another aspect of the invention, a method for manufacturing an antenna includes the steps of: forming a depression in a film, and forming a conductive body in the depression of the film.

In another aspect of the invention, a method for manufacturing an antenna includes the steps of: forming a depression in a film, attaching a conductive sheet to a surface and the depression of the film; and selectively etching the conductive sheet so as to leave the conductive sheet provided in the depression of the film. Further, the conductive sheet corresponds to a conductive film, a film-type metal plate, or a conductive body that is thinly beaten into a paper-like form. For example, a metal foil can be given.

In another aspect of the invention, a method for manufacturing an antenna includes the steps of: forming a depression in a film, and selectively discharging a composition with a conducting property in the depression of the film to form a conductive body in the depression. That is, the conductive body is directly formed in the depression of the film. As a method for forming the conductive body directly in the depression, a droplet discharging method, a printing method such as screen printing, an atmospheric pressure plasma apparatus and the like can be used. Further, the droplet discharging method is a method by which a droplet (also referred to as a dot) of a composition containing a material for a conductive film, an insulating film or the like is selectively discharged (injected) into a predetermined portion. This droplet discharging method is also referred to as an ink-jet method depending on its technique.

In the present invention, the depression of the film can be formed by pressing a mold against the film. Alternatively, the depression may be directly formed on the film by irradiating the film with laser light.

In another aspect of the invention, a method for manufacturing an antenna includes the steps of: attaching a conductive film to a film, pressing a mold against the film and the conductive sheet to form a depression, and selectively etching the conductive sheet so as to leave the conductive sheet provided in the depression of the film. Alternatively, the conductive sheet except for the conductive film provided in the depression of the film may be separated from the film using physical means (physical force) so as to leave the conductive sheet provided in the depression without performing the etching treatment. Further, the physical means is means recognized by physics rather than chemistry. Concretely, this physical means indicates dynamical means or mechanical means having a process that can be applied to the law of mechanics, and also indicates means by which some dynamical energy (mechanical energy) is changed. That is, the separation using the physical means indicates that the conductive sheet is separated by applying an impact (stress) to the conductive sheet from an external portion using, for example, a human hand, pressure of a gas blown from a nozzle, supersonic wave, a load using a wedge-shaped member, and the like.

Another aspect of the invention, a method for manufacturing an antenna includes the steps of: attaching a conductive sheet to a film, selectively cutting the conductive sheet, pressing a mold against the cut conductive sheet and the film underlying the conductive sheet to form a depression, and selectively etching the conductive sheet so as to leave the conductive sheet provided in the depression of the film. Alternatively, the conductive sheet except for the conductive sheet provided in the depression of the film may be selectively separated from the film so as to leave the conductive sheet provided in the depression without performing the etching treatment.

In the above structure, the depression may be formed by pressing the mold against the film while performing a heat treatment.

By electrically connecting the antenna formed according to the above described manufacturing method to an element formation layer provided over a substrate, a semiconductor device can be manufactured. In addition, the element formation layer can be connected to the antenna through a connection terminal.

An antenna including a conductive body that has high adhesive strength with respect to a base film and a semiconductor device including the antenna can be obtained according to the present invention, making it possible to prevent the conductive film from separating from the base film. Moreover, since the conductive body is embedded in the base film, when adhering the antenna to a subject material, damage applied to the subject material that is caused due to a structure of the antenna can be reduced.

BRIEF DESCRIPTION OF DRAWINGS

FIGS. 1A to 1F are cross sectional views showing a method for manufacturing an antenna of the present invention;

FIGS. 12A and 12B are cross sectional views showing a separating step and a sealing step of a semiconductor device of the invention;

FIGS. 13A and 1313 are diagrams showing a structure when using a semiconductor device as a wireless chip;

BEST MODE FOR CARRYING OUT THE INVENTION

Figure 2A:
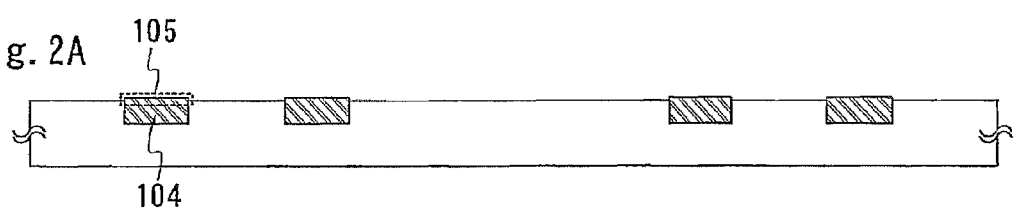
FIGS. 2A to 2C are cross sectional views showing a structure of an antenna of the invention.

The embodiment modes according to the present invention will hereinafter be described referring to the accompanying drawings. It is easily understood by those who skilled in the art that the embodiment modes and details herein disclosed can be modified in various ways without departing from the purpose and the scope of the invention. The present invention should not be interpreted as being limited to the description of the embodiment modes to be given below. Further, reference numerals indicating same portions are commonly used in the drawings.

Figure 15A:
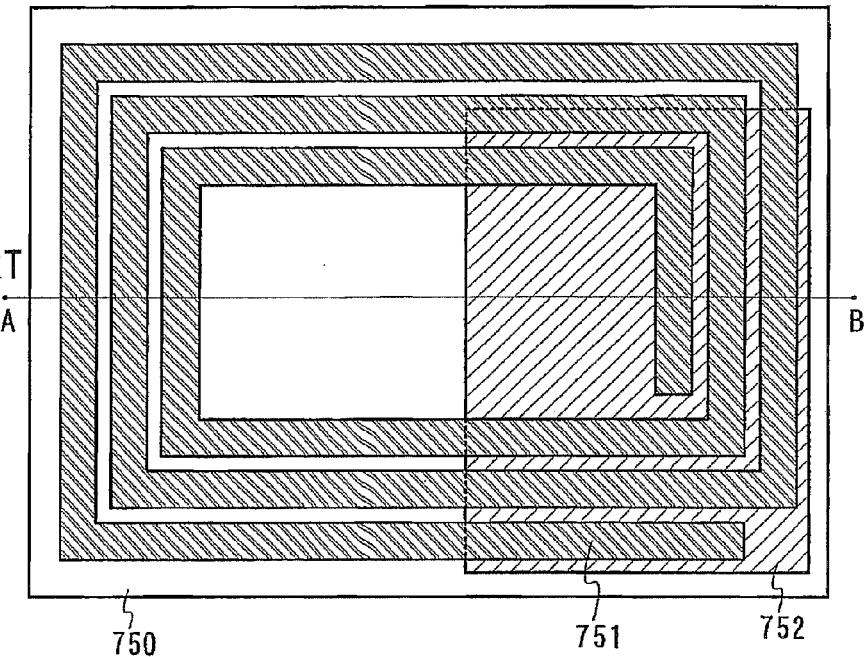
FIG. 15A is a top view and FIGS. 15B and 15C are cross sectional views showing a structure of a conventional wireless chip.
Figure 15B:
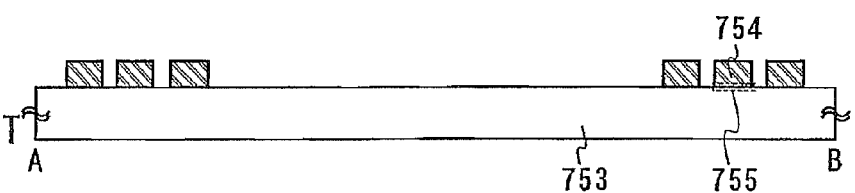
Figure 15C:
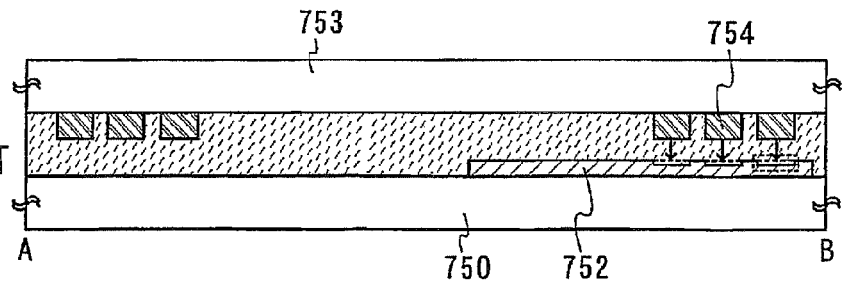

It is an object of the present invention to provide a semiconductor device with high reliability in that when the semiconductor device is formed by attaching an element formation layer and an antenna, the element formation layer is not damaged by a structure of the antenna. For example, a case where a semiconductor device is manufactured by attaching an antenna 751 and an element formation layer 752 (also referred to as an IC chip) that are formed separately as shown in FIG. 15A will be described. In this case, for example, when a conductive body 754 is attached to a surface of a base film 753 as shown in FIG. 15B, an attached area 755 between the base film and the conductive body is reduced in accordance with the miniaturization of the antenna, thereby causing a problem that the conductive body 754 is easily separated from the base film 753. In addition, when the antenna 751 and the element formation layer 752 are attached to each other such that they are overlapped each other to miniaturize the semiconductor device, stress is locally applied to the element formation layer, which is positioned under a protruding pattern of the antenna (i.e., a portion where the conductive body 754 is provided). Therefore, as shown in FIG. 15C, the shape of the element formation layer positioned under the protruding pattern of the antenna is changed or the element formation layer is cracked to be destroyed. As a consequence, there is concern that problems such as the reduction in reliability of the semiconductor device are caused.

Figure 8A:
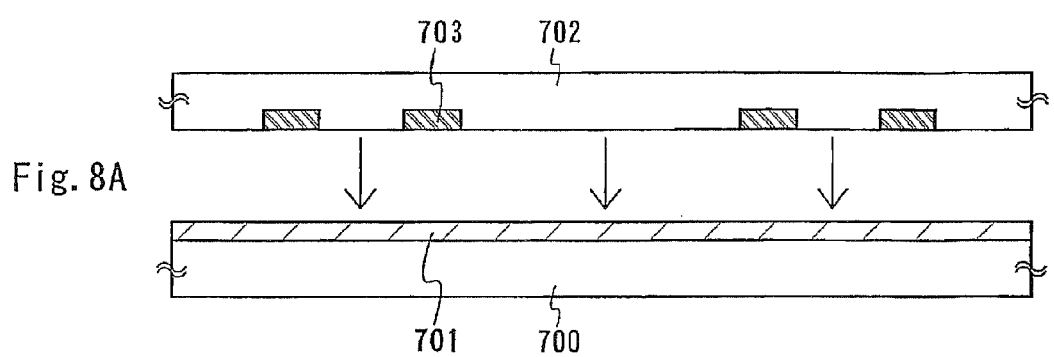
FIGS. 8A and 8B are cross sectional views showing attachment of an element formation layer and an antenna.

According to the present invention, in an antenna including a base film 702 and a conductive body 703, the conductive body 703 is embedded in the base film 702 so as to planarize the surface of the antenna (see FIG. 8A). Also, by attaching the surface of the antenna, which is planarized, to an element formation layer 701 that is provided over a substrate 700, a semiconductor device is formed without applying damage to the element formation layer (see FIG. 8B).

In the present invention, the element formation layer is provided with various kinds of functional circuits such as power generating means, controlling means, memorizing means, and a resonance capacitor portion by using a thin film transistor (TFT) formed over a substrate, a field effect transistor (FET) in that a channel region is provided over a semiconductor substrate such as Si, and the like.

Accordingly, by attaching the antenna to the element formation layer without applying stress to the element formation layer, a semiconductor device with high reliability can be obtained. Further, the shape of the antenna is not particularly limited in the present invention. A structure of the above antenna and a method for manufacturing thereof, and a semiconductor device and a method for manufacturing thereof will hereinafter be described in detail with reference to the drawings.

[Embodiment Mode 1]

An example of an antenna and a method for manufacturing the antenna will be described in Embodiment Mode 1. Concretely, an antenna having a structure in that at least a part of a conductive body is embedded in a base film (also referred to as a film or a substrates) will be formed. A structure of the antenna and a method for manufacturing thereof will be described below referring to the drawings.

A base film 100 and a mold 101 used for forming a pattern on a surface of the base film 100 are prepared (FIG. 1A). As the base film 100, a film type substrate formed using thermoplastic resin, e.g., polyester such as polyethylene terephthalate, polyolefin such as polyethylene, polyvinyl alcohol, polyvinylidene chloride, polyvinyl chloride, polyamide such as nylon 6, nylon 66 and nylon 8, and the like can be used. In addition, a substrate formed using thin glass or the like on which the thermoplastic resin is applied may be used. As the mold 101, a metal mold formed using metal such as nickel (Ni), cobalt (Co), copper (Cu), iron (Fe) and zinc (Zn) or an alloy thereof can be used. Alternatively, a mold formed using silicon (Si) or the like can be used.

Next, the mold 101 is pressed against the base film 100 (FIG. 1B) to form a depression 102 in the base film 100 selectively (FIG. 1C). In this case, a heat treatment is preferably performed along with the pressing treatment so as to form the pattern easily. The shape of the depression is not particularly limited. An example of forming the depression with a rectangular cross section is shown here.

Subsequently, a conductive sheet 103 is pressed against the surface of the base film 100 in which the depression 102 is formed (FIG. 1D) to attach the conductive sheet 103 to the surface of the base film 100 (FIG. 1E). In this case, a heat treatment may be performed while performing the pressing treatment. As the conductive sheet, for instance, a paper-like material (e.g., a metal foil) that is formed by beating out metal such as copper (Cu), aluminum (Al), silver (Ag) and gold (Au) thinly can be used.

Thereafter, the conducive sheet 103 attached to the surface of the base film 100 is selectively subjected to an etching treatment while leaving the conductive sheet that is attached to the depression 102 of the base film. Consequently, an antenna in which a conductive body 104 is embedded in the base film 100 is completed (FIG. 1F). In such an antenna, since an area of attaching the base film 100 and the conductive body 104 is large and the conductive body is embedded in the base film, the conductive body 104 is difficult to be separated from the base film.

FIGS. 1A to 1F show one example of the structure the antenna in that the surface of the base film 100 where is not provided with the depression (hereinafter referred to as a top surface of the base film) and a top surface of the conductive body 104 are leveled. However, the present embodiment mode is not limited to this structure. For example, a structure in that the top surface of the base film and the top surfaces of the conductive body 104 are not leveled may be employed. Alternatively, a structure in that the conductive body 104 is also formed on the top surface of the base film may be employed. Specific examples thereof will be shown in FIGS. 2A to 2C.

Figure 2B:
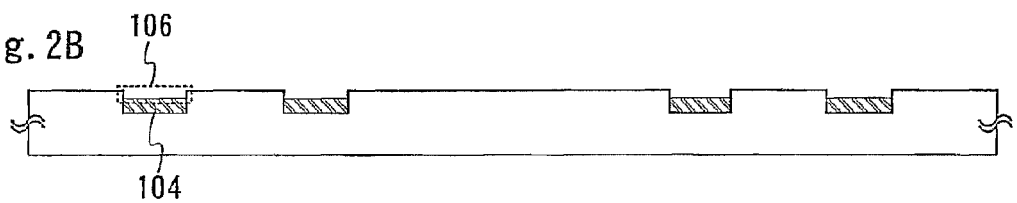
Figure 2C:
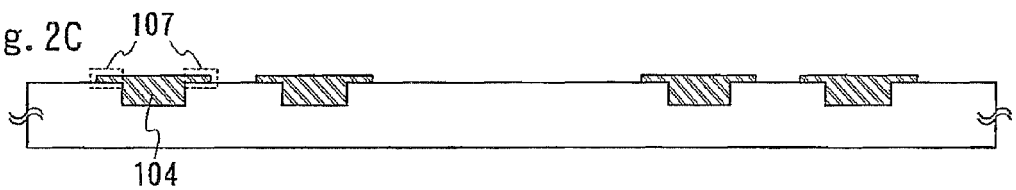

In an antenna structure as shown in FIG. 2A, the top surface of the base film is higher than the top surface of the conductive body 104. That is, this structure has a protruding portion 105 where the conductive body 104 protrudes from the base film 100. In an antenna structure as shown in FIG. 2B, the top surface of the conductive body 104 is lower than the top surface of the base film. That is, this structure has a recessed portion 106 where the conductive body is receded from the top surface of the base film. In an antenna structure as shown in FIG. 2C, the top surface of the conductive body is higher than the top surface of the base film and the conductive body is also provided on the top surface of the base film. These structures can be selectively formed by controlling an etching position or etching time when etching the conductive sheet 103 as shown in FIG. 1E.

Each exposed area of the conductive bodies of the antenna structures as shown in FIGS. 2A and 2C is larger than an exposed area of the conductive body of the antenna structure as shown in FIGS. 1A to 1F, and therefore, the antennas structures as shown in FIGS. 2A and 2C have an advantage in that each antenna is easily connected to a subject material using conductive adhesive or the like because of a large connection area. Also, in FIGS. 2A and 2C, a cross sectional area of each conductive body can be made large, making it possible to keep the resistance low. Consequently, a communication distance of a semiconductor device can be increased. Further, the antenna structure as shown in FIG. 2B has an advantage in that the conductive body is more difficult to be separated from the base film as compared with the antenna structure as shown in FIGS. 1A to 1E. An operator can arbitrarily select the antenna structure depending on an intended purpose of the antenna.

Figure 3A:
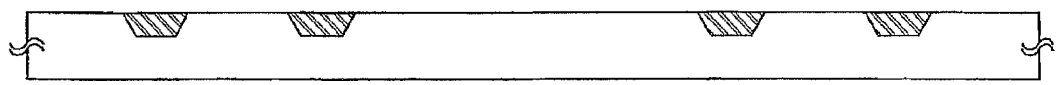
FIGS. 3A to 3C are cross sectional views showing a structure of an antenna of the invention.
Figure 3B:
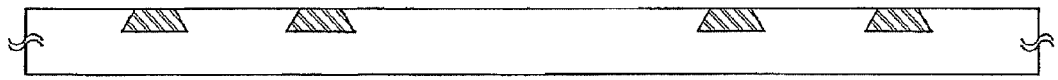
Figure 3C:
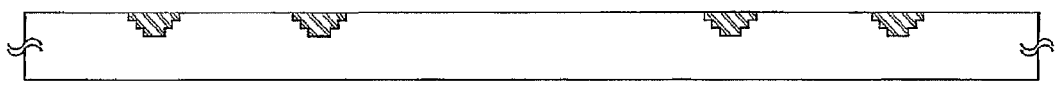

Although the base films as shown in FIG. 1F and FIGS. 2A to 2C having the depressions with a rectangular cross section are shown, the present embodiment mode is not limited thereto. Any type of depression may be provided in the base film so long as the conductive body can be embedded in the depression. For instance, a depression of which a cross section has a tapered shape in that an upper side is longer than a lower side (as shown in FIG. 3A) may be formed. A depression of which a cross section has an inversely tapered shape (i.e., a lower side is longer than an upper side) (as shown in FIG. 3B) may be formed. Or, a depression of which a cross section has a stepped shape (as shown in FIG. 3C) may be formed.

Since the shape of the depression formed in the base film 100 depends on a shape of a protruding portion of the mold 101 in this embodiment mode, a depression having a cross sectional shape that is different from the above described rectangular shape can be formed by changing the shape of the mold 101. Also, the structures as shown in FIGS. 3A to 3C can be freely combined with the structures as shown in FIGS. 1A to 1F and FIGS. 2A to 2C.

By utilizing the method for manufacturing an antenna described in this embodiment mode, an antenna of which the surface is planarized and a conductive body is difficult to be separated from a base film can be obtained. Also, by using the antenna having the flat surface, when the antenna is attached to a subject material, the stress is not locally applied to the subject material. Accordingly, damage of the subject material can be reduced, making it possible to improve the yield in a manufacturing process. Moreover, when forming a thin and flexible semiconductor device, bending of the semiconductor device caused by stress can be prevented by using the above described antenna. Furthermore, in each antenna structure described above, the conductive body may be formed to have any thickness so long as the conductive body can be embedded in the base film.

[Embodiment Mode 2]

A method for manufacturing an antenna that is different from Embodiment Mode 1 will be described in Embodiment Mode 2 with reference to the drawings. Concretely, a case where a pressing treatment is carried out after forming a conductive sheet on a base film will be described.

Figure 4A:
FIGS. 4A to 4E are cross sectional views showing a method for manufacturing an antenna of the invention.

A conductive sheet 103 is attached to a surface of a base film 100 (FIG. 4A). Alternatively, a base film 100 on which the conductive sheet 103 has been provided in advance is prepared. The conductive sheet can be attached to the base film by using, for example, adhesive such as epoxy resin. Further, the materials as described in Embodiment Mode 1 can be used for the base film 100 and the conductive sheet 103.

Figure 4B:
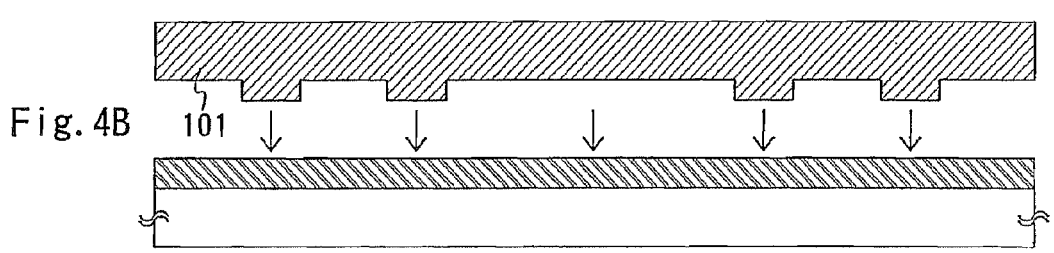
Figure 4C:
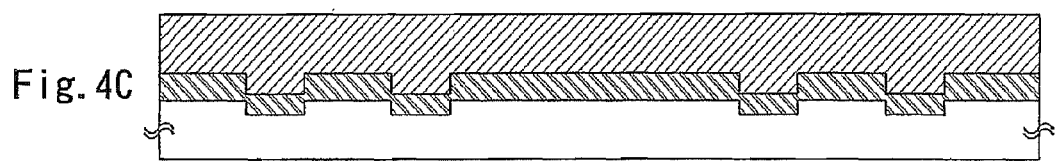

Subsequently, a mold 101 is prepared (FIG. 4B). As the mold 101, the mold described in Embodiment Mode 1 can be employed. Next, the mold 101 is pressed against the conductive sheet 103 formed on the base film 100 to selectively form a depression 102 in the base film 100 and the conductive sheet 103 (FIG. 4C). In order to form a pattern easily, a heat treatment is preferably carried out along with the pressing treatment. The cross sectional shape of the depression is not particularly limited. The depression of which a cross section has a rectangular shape is shown here as one example.

Figure 4D:
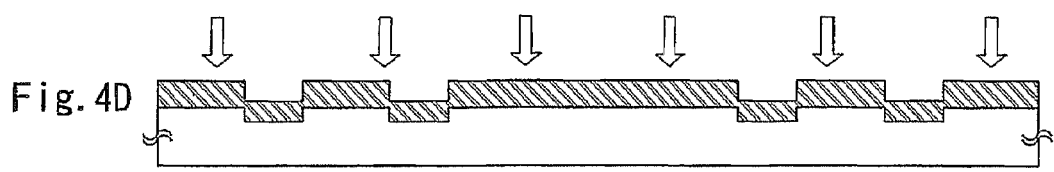
Figure 4E:

Afterwards, the conductive sheet 103 formed on the surface of the base film 100 is selectively etched (FIG. 4D) so as to complete an antenna in that a conductive body 104 is embedded in the base film 100 (FIG. 4E). Also, by controlling an etched position and etching time, the above described structures as shown in FIGS. 2A to 2C can be formed. In addition, by changing the shape of the mold 101, antennas having the structures as shown in FIGS. 3A to 3C can be formed. When after forming the conductive sheet on the base film in advance, the mold is pressed against the conductive sheet and the base film by the pressing treatment, an antenna having the structure in that the conductive sheet is embedded in the base film can be formed.

Also, another method that is different from the above method will be described with reference to FIGS. 5A to 5E.

Figure 5A:
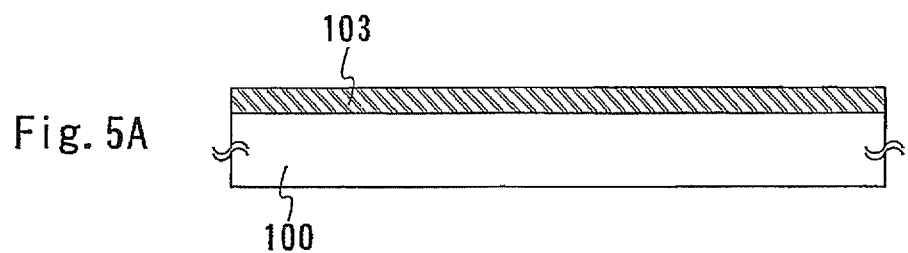
FIGS. 5A to 5E are cross sectional views showing a method for manufacturing an antenna of the invention.
Figure 5B:
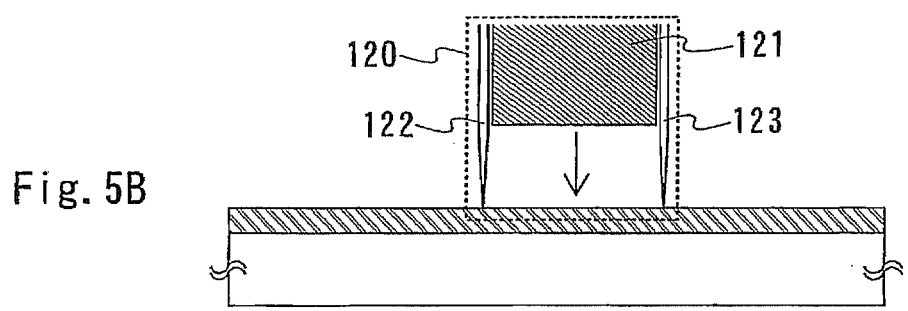

A conductive sheet 103 is attached to a surface of a base film 100 (FIG. 5A). Alternatively, a base film 100 on which a conductive sheet 103 has been provided in advance is prepared.

Figure 5C:
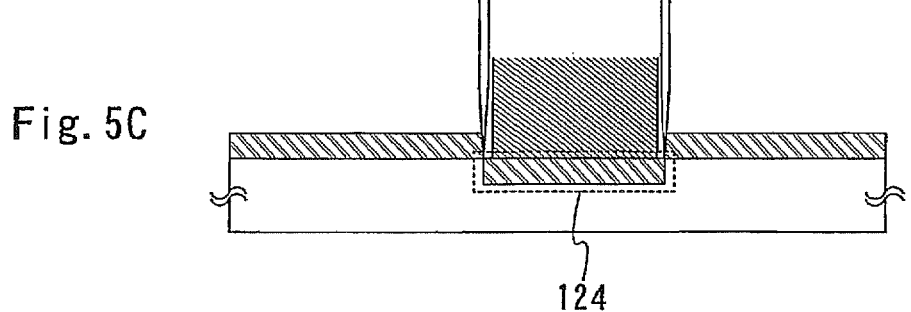
Figure 5D:
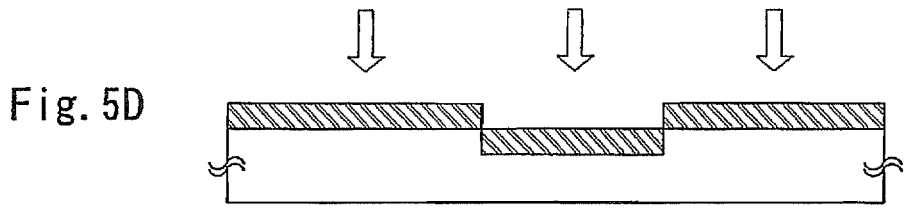

Subsequently, a part of the conductive sheet 103 provided on the base film 100 is subjected to a pressing treatment by using pressing means 120 (FIG. 5B) to press the part of the conductive sheet 103 (hereinafter, referred to as a conductive sheet 124) into the base film 100 (FIG. 5C). At this moment, the pressing treatment is performed while carrying out a heat treatment. The pressing means 120 includes at least a pressing part 121, and cutting parts 122 and 123 that are provided on each end of the pressing part 121. By using the pressing means 120, the conductive sheet 103 is cut using the cutting parts 122 and 123, and then the conductive sheet 124 cut by the cutting parts is pressed into the base film by the pressing part 121. According to the above described process, a structure in that only the conductive sheet 124 is embedded in the base film 100 can be obtained.

Figure 5E:
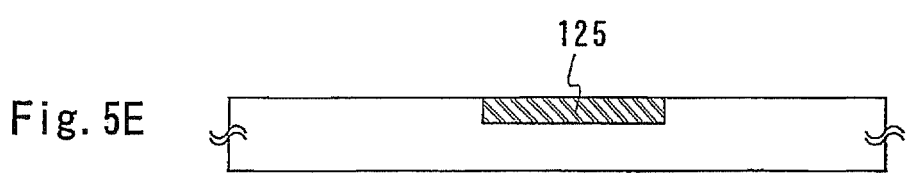

Thereafter, the conductive sheet 103 is selectively etched (FIG. 5D) to remove unnecessary portions, thereby completing an antenna in that a conductive body 125 is embedded in the base film 100 (FIG. 5E).

In the method for manufacturing an antenna as shown in FIGS. 5A to 5E, a position of a top surface of the base film and a position of a top surface of the conductive body 125 can be differed as shown in FIGS. 2A to 2C. For instance, in order to form the structure in which the conductive body 125 protrudes from the top surface of the base film (as shown in FIG. 2A), the pressure applied by the pressing means 120 may be reduced in the pressing treatment. In order to form the structure in that the conductive layer 125 is embedded in the base film (as shown in FIG. 2B), the pressure applied by the pressing means 120 may be increased in the pressing treatment. Further, in order to form the structure in that the top surface of the conductive body 125 is higher than the top surface of the base film and the conductive body is also formed on the top surface of the base film (as shown in FIG. 2C), the pressure applied by the pressing means 120 may be reduced in the pressing treatment and the etching treatment may be selectively carried out so as to leave the conductive body provided on the top surface of the base film. Also, by changing the shape of the pressing part, a conductive body having each shape as shown in FIGS. 3A to 3C can be formed in the base film.

Further, examples of selectively removing the conductive sheet provided except in the depression by performing the etching treatment are shown in FIGS. 4A to 4E and FIGS. 5A to 5E. However, the present embodiment mode is not limited thereto. The conductive sheet formed except in the depression may be selectively separated from the base film by using physical means without performing the etching treatment such that the conductive sheet formed in the depression of the base film is left. This is especially effective in the case where the conductive sheet embedded in the depression of the base film is cut from the other conductive sheet (e.g., FIG. 5D).

Furthermore, the present embodiment mode can be implemented by being freely combined with the above embodiment modes.

[Embodiment Mode 3]

Embodiment Mode 3 will describe a method for manufacturing an antenna that is different from the above embodiment modes. Specifically, a method for forming a depression in a base film and a method for forming a conductive body on a base film having a depression will be described below, respectively.

The method for forming a depression in a base film that is different from the above embodiment mode will be described.

The method for forming a depression in a base film by pressing a mold against the base film is described in the above embodiment mode (FIGS. 1A to 1C). Alternatively, a case of directly forming a depression in a base film by irradiating the base film with laser light will be described here with reference to FIGS. 6A and 6B.

Figure 6A:
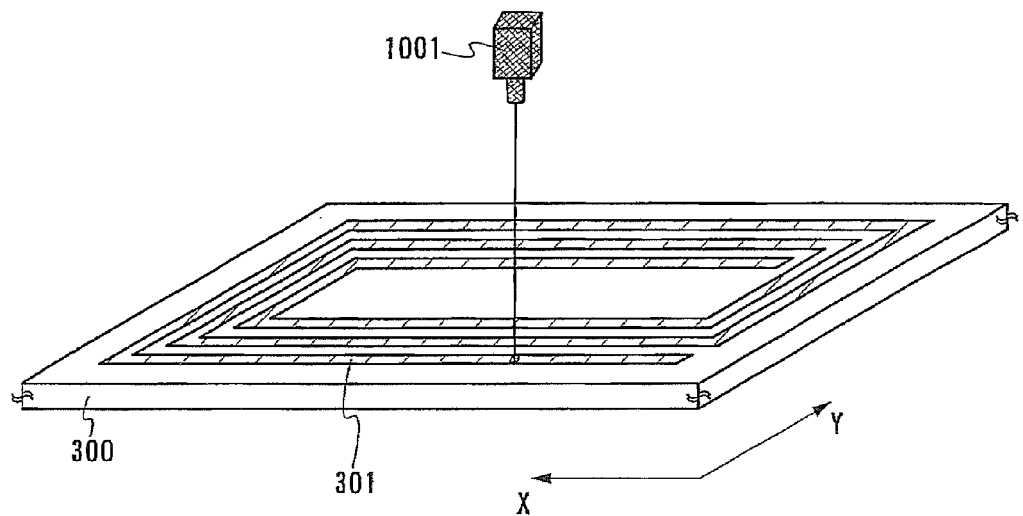
FIGS. 6A and 6B are diagrams showing a method for manufacturing an antenna using a laser direct writing apparatus.

A base film 300 is prepared. Next, the base film 300 is selectively irradiated with laser light by using a laser direct-writing apparatus 1001 to form a depression 301 (FIG. 6A).

Figure 6B:
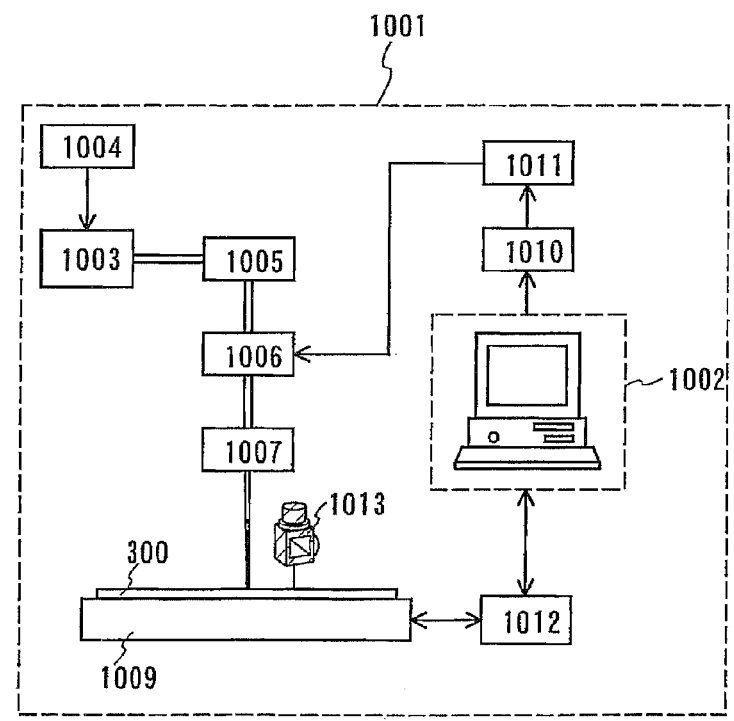

The laser direct-writing apparatus 1001 comprises: a personal computer (hereinafter, PC) 1002 for executing various kinds of controls in irradiating a subject material with laser light; a laser oscillator 1003 for oscillating laser light; a power source 1004 of the laser oscillator 1003; an optical system (ND filter) 1005 for attenuating laser light; an acoustooptical modulator (AOM) 1006 for modulating the intensity of laser light; an optical system 1007 that includes a lens for zooming in or out a cross section of laser light, a mirror for changing a light path, and the like; a transferring mechanism 1009 having an X-axis stage and a Y-axis stage; a D/A converter 1010 for converting control data output from the PC 1002 into digital/analog data; a driver 1011 for controlling the acoustooptical modulator 1006 in accordance with an analog voltage output from the D/A converter; a driver 1012 for outputting a driving signal for driving the transferring mechanism 1009; and an autofocusing mechanism 1013 for focusing laser light on a subject material (FIG. 6B).

As the laser oscillator 1003, a laser oscillator capable of oscillating ultraviolet light, visible light or infrared light can be used. As the laser oscillator, an excimer laser oscillator such as KrF, ArF, XeCl and Xe, a gas laser oscillator such as He, He—Cd, Ar, He—Ne and HF, a solid-state laser oscillator using a crystal such as YAG, $GdVO_4$, $YVO_4$, YLF, and $YAlO_3$ doped with Cr, Nd, Er, Ho, Ce, Co, Ti or Tm, and a semiconductor laser oscillator such as GaN, GaAs, GaAlAs and InGaAsP can be used. Further, a fundamental wave or second to fifth harmonic is preferably applied to the solid-state laser oscillator.

Next, an irradiation method using the laser direct-writing apparatus will be described. When the base film 300 is loaded on the transferring mechanism 1009, the PC 1002 detects a position of a marker marked on the base film by a camera not shown in the drawing. The PC 1002 generates transferring data for moving the transferring mechanism 1009 based on the positional data of the marker detected by the camera and a writing pattern data that has been input in the PC 1002 previously.

Thereafter, the PC 1002 controls the amount of light output from the acoustooptical modulator 1006 through the driver 1011 and laser light output from the laser oscillator 1003 is attenuated by the optical system 1005. Then, the amount of light is controlled by the acoustooptical modulator 1006 to have a predetermined amount. Meanwhile, a light path and a shape of a beam spot of the laser light output from the acoustooptical modulator 1006 are changed by the optical system 1007 and the light is condensed by the lens. Thereafter, the condensed laser light is emitted to the base film.

At this moment, the transferring mechanism 1009 is controlled to be moved in an X-axis direction and a Y-axis direction according to the transferring data generated by the PC 1002. Consequently, the laser light is emitted to a predetermined portion and light energy is converted into heat energy, making it possible to write a pattern selectively on the base film. As described above, a pattern can be formed in a base film by utilizing the method for irradiating the base film with laser light. Further, the base film is irradiated with laser light while moving the transferring mechanism 1009 here. Alternatively, the laser light may be scanned in the X-axis direction and the Y-axis direction by adjusting the optical system 1007.

In this way, the pattern can be formed in the base film by irradiating the base film with laser light. In the case of using laser light, a shape of a pattern can be determined by inputting data about the shape of the pattern in a computer, plural patterns having different shapes can be easily formed.

Next, a method for forming a conductive body on a base film in which a pattern is formed, which is different from the above embodiment mode, will be described with reference to FIGS. 7A and 7B.

A base film 400 in which a pattern is formed is prepared. The pattern may be formed by pressing a mold against the base film as described above. Alternatively, the pattern may be directly formed by irradiating the base film with laser light as described above. Subsequently, a conductive body 401 is formed in the pattern provided in the base film. In this embodiment mode, a material having a conducting property is selectively provided in the pattern to form the conductive body 401. An example of forming the conductive body 401 by utilizing a droplet discharging method is shown here (FIGS. 7A and 7B). Further, the droplet discharging method is a method by which a droplet (also referred to as a dot) of a composition containing a material for a conductive film, an insulating film or the like is selectively discharged (injected) to form a pattern in a predetermined portion. This droplet discharging method is also referred to as an ink-jet method depending on its technique.

As the conductive body formed by the droplet discharging method, a conducting material including one or plural kinds of metal such as Ag, Au, Cu and Pd, or a metal compound is used. Further, a conducting material including one or plural kinds of metal such as Cr, Mo, Ti, Ta, W and Al or a metal compound can be used if aggregation of the metal or the metal compound can be suppressed by using a dispersing agent and the metal or the metal compound can be dispersed in a solution. Also, by discharging a conducting material plural times using the droplet discharging method, a plurality of conductive films that are laminated together can be formed. Further, as a composition discharged from a droplet discharging apparatus 402, a solvent in that any one of Au, Ag and Cu is dissolved or dispersed is preferably used in consideration of a specific resistance value. More preferably, Ag or Cu with low resistance may be used. When using Ag or Cu, a barrier film may be provided along with the Ag or Cu in order to prevent impurities. As the barrier film, a silicon nitride film or nickel boron (NiB) can be used.

In this embodiment mode, a depression pattern is provided in the base film 400 in advance, and a conducting material may be formed in the depression pattern by discharging the conducting material therein. Accordingly, the conducting material discharged from the droplet discharging apparatus 402 can be prevented from spreading when the conducting material is adhered to the base film. Using the droplet discharging method allows to form the conductive body 401 in the pattern portion of the base film 400 accurately. In addition, the conductive body can be directly formed in the pattern portion of the base film, and hence, a step of an etching treatment can be eliminated.

Figure 7A:
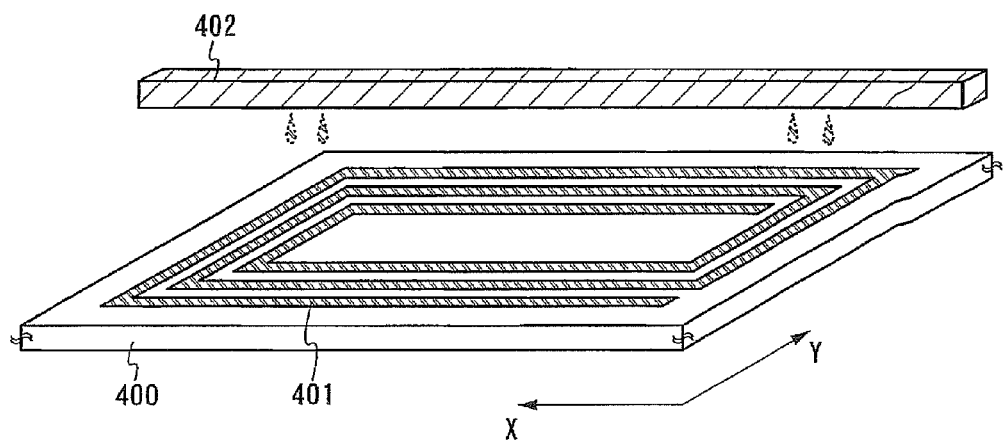
FIGS. 7A and 7B are diagrams showing a method for manufacturing an antenna using a droplet discharging method.
Figure 7B:
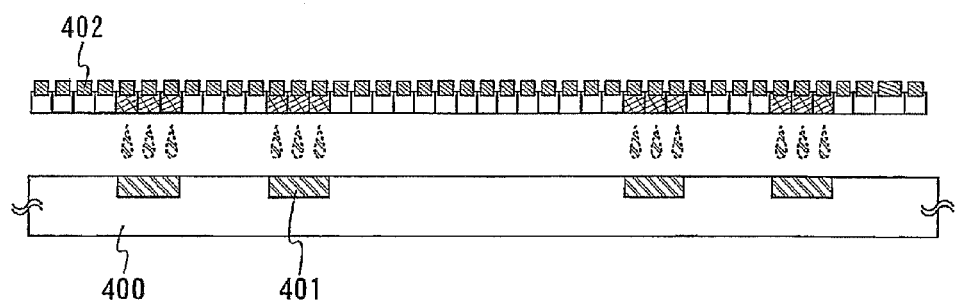

Although FIGS. 7A and 7B show an example of forming the conductive body 401 by the droplet discharging method, the present invention is not limited thereto. Alternatively, the conductive body may be selectively formed by using various kinds of printing methods such as screen printing and gravure printing or an atmospheric pressure plasma apparatus.

Moreover, the present embodiment mode can be implemented by being freely combined with the above embodiment modes.

[Embodiment Mode 4]

Figure 8B:
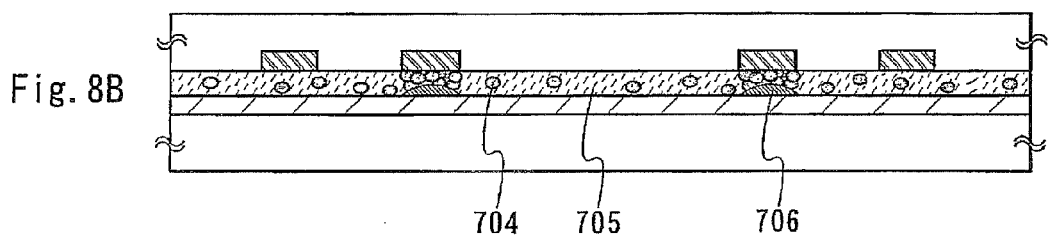

Embodiment Mode 4 will describe a case where a semiconductor device is formed by bonding an antenna manufactured according to the above embodiment modes and an element formation layer with reference to FIGS. 8A and 8B.

At first, an element formation layer and an antenna that are manufactured individually are prepared (FIG. 8A). The element formation layer 701 is provided over a substrate 700 here. The antenna is formed by embedding a conductive body 703 in a base film 702. As the substrate 700, a glass substrate such as barium borosilicate glass and alumino borosilicate glass, a quartz substrate, a ceramic substrate, or a flexible substrate such as plastic is used. The element formation layer 701 is provided thereon. Alternatively, a semiconductor substrate such as Si is used as the substrate 700 and the element formation layer 70 1 may be directly formed on the substrate.

Next, the element formation layer 701 and the antenna are connected to each other (FIG. 8B). As a technique for connecting the element formation layer 701 to the antenna, a technique that uses conductive adhesive such as silver paste, copper paste and carbon paste or an anisotropic conductive film, and a technique that performs solder joint are known, and any method can be employed. In this embodiment mode, a case of using an anisotropic conductive film 705 that contains a conductive body 704 is shown. Further, a connection terminal 706 may be provided to electrically connect the conductive body 703 to the element formation layer 701 easily.

In the antenna used in this embodiment mode, since the conductive body 703 is embedded in the base film 702, when the element formation layer is connected to this antenna, the conductive body can be prevented from being separated from the base film. Also, a conventional antenna structure has a problem that since a portion where a conductive body is formed has a protruding portion, an element formation layer underlying the conductive body is locally applied with stress so that the element formation layer is destroyed. However, this problem can be solved by using the antenna structure according to this embodiment mode. As set forth above, by attaching the element formation layer to the antenna without applying stress to the element formation layer, a semiconductor device having high reliability can be obtained.

Moreover, the present embodiment mode can be implemented by being freely combined with the above embodiment modes.

[Embodiment Mode 5]

A method for manufacturing a semiconductor device that comprises an antenna will be described in Embodiment Mode 5.

Figure 9A:
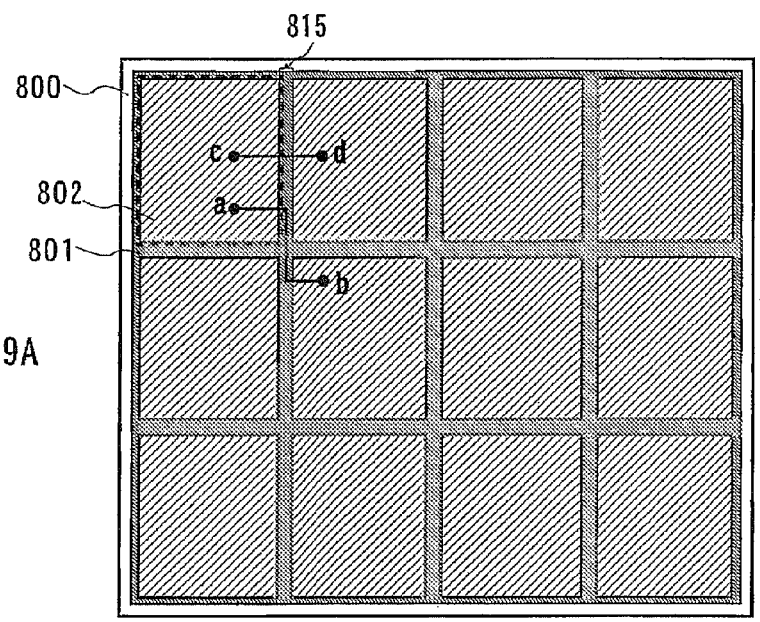
FIG. 9A is a top view and FIGS. 9B and 9C are cross sectional views showing a method for manufacturing a semiconductor device of the invention.

A case of forming a plurality of semiconductor devices over a substrate 800 will be described with reference to FIGS. 9A to 9C. Further, FIG. 9A is a top view, FIG. 9B is a cross sectional view along a line a-b of FIG. 9A, and FIG. 9C is a cross sectional view along a line c-d of FIG. 9A.

Figure 9B:
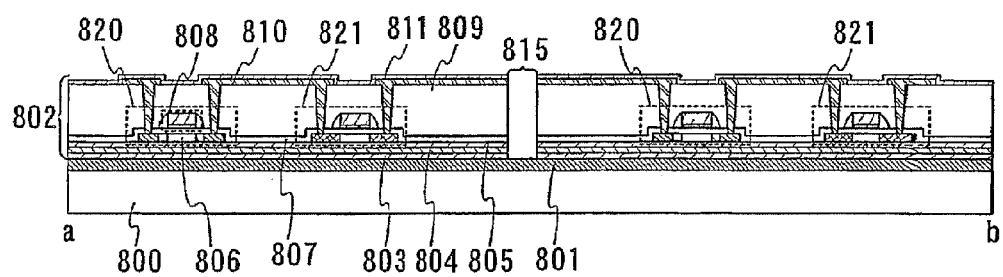
Figure 9C:
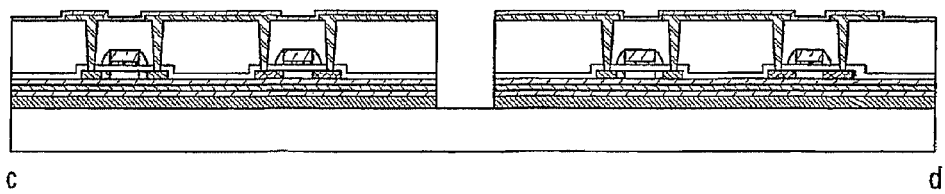

At first, a separation layer 801 and element formation layers 802 are formed over the substrate 800 as shown in FIGS. 9B and 9C.

As the substrate 800, for example, a glass substrate such as barium borosilicate glass and alumino borosilicate glass, a quartz substrate, a ceramic substrate, or the like can be used. In addition, a metal substrate including stainless steel or a semiconductor substrate on which an insulating film is provided may be used. A flexible substrate formed using synthetic resin such as plastic tends to have a lower heat resistance property as compared to the above mentioned substrates; however, if this substrate can withstand a processing temperature of the manufacturing process, it can be employed. Also, a semiconductor substrate such as Si may be used as the substrate 800. The surface of the substrate 800 may be planarized by polishing using a CMP technique or the like. Further, a glass substrate is used as the substrate 800 in this embodiment mode.

As the separation layer 801, an single layer or a laminated layer of an element selected from W, Ti, Ta, Mo, Nb, Nd, Ni, Co, Zr, Zn, Ru, Rh, Pd, Os, Ir and Si, or a metal material or a compound material mainly containing the element can be used. In this embodiment mode, a metal film containing W is used as the separation layer 801. Further, the metal film containing W can be formed by CVD, sputtering, electronic beam, or the like. The metal film containing W is formed by sputtering here. Alternatively, the metal film on which oxide is formed may be used as the separation layer 801. The oxide may be formed on the metal film by CVD or sputtering. Also, the oxide can be formed on the metal film by performing a heat treatment. For example, as a metal film and a metal oxide film, a combination of W and WOx, a combination of Mo and MoOx, a combination of Nb and NbOx, a combination of Ti and TiOx (x=2 to 3), or the like can be used.

The separation layer 801 is directly formed on the substrate 800 here. Alternatively, a base film may be provided between the substrate 800 and the separation layer 801. The base film can be formed using an insulating film with a single layer structure or a laminated structure containing oxygen or nitrogen such as silicon oxide (SiOx), silicon nitride (SiNx), silicon oxynitride (SiOxNy) (x>y), and silicon nitride oxide (SiNxOy) (x>y). In particular, when there is concern that contamination is caused through the substrate, the base film is preferably formed.

The element formation layers 802 are formed using thin film transistors (also abbreviated as TFTs) that have semiconductor films as active regions. The element formation layers 802 comprise n-channel TFTs 820 and p-channel TFTs 821 each including an insulating film, a semiconductor film 806 formed in a desired shape, an insulating film serving as a gate insulating film (hereinafter, referred to as a gate insulating film 807), and a conductive film (hereinafter, referred to as a gate electrode 808) serving as a gate electrode provided on the gate insulating film 807.

The semiconductor films have channel formation regions and impurity regions (including source regions, drain regions, and LDD regions). These semiconductor films are classified into the semiconductor films for the n-channel TFTs 820 and the semiconductor films for the p-channel TFTs 821 depending on impurity elements added to the semiconductor films. The element formation layers also have wirings 810 that are provided on an interlayer insulating film 809 so as to be in contact with the respective impurity regions.

The insulating film may have a laminated structure. In this embodiment mode, the insulating film includes a first insulating film 803, a second insulating film 804 and a third insulating film 805. For example, a silicon oxide film is used as the first insulating film, a silicon oxynitride film is used as the second insulating film, and a silicon oxide film is used as the third insulating film.

The semiconductor films 806 may be formed using an amorphous semiconductor, an SAS in that an amorphous state and a crystalline state are mixed, a microcrystalline semiconductor in that crystal grains with 0.5 to 20 nm can be observed in an amorphous semiconductor, and a crystalline semiconductor. When using a substrate that can withstand the processing temperature, e.g., a quartz substrate, a crystalline semiconductor film may be formed thereon by CVD or the like.

In this embodiment mode, an amorphous semiconductor film is formed and is crystallized by a heat treatment to form a crystalline semiconductor film. The heat treatment can be carried out by using a heating furnace, laser irradiation, light irradiation generated from a lamp other than the laser light (lamp annealing), or a combination thereof.

When using laser irradiation, a continuous wave laser (a CW laser) or a pulsed laser can be used. One or more kinds of an Ar laser, a Kr laser, an excimer laser, a YAG laser, a $Y_2O_3$ laser, a $YVO_4$ laser, a YLF laser, a $YAlO_3$ laser, a glass laser, a ruby laser, an alexandrite laser, a Ti:sapphire laser, a copper vapor laser, and a gold vapor laser can be used. By irradiating the amorphous semiconductor film with a fundamental wave of such a laser or second to forth harmonics of the fundamental wave, large-size crystal grains can be obtained. For instance, a second harmonic (532 nm) or a third harmonic (355 nm) of an $Nd:YVO_4$ laser (with a fundamental wave of 1,064 nm) can be used. In this case, an energy density of about 0.01 to 100 $MW/cm^2$ (and preferably, 0.1 to 10 $MW/cm^2$) is required for the laser. Also, the scanning speed is set to be about 10 to 2,000 cm/sec.

When performing the heat treatment using a heating furnace, the amorphous semiconductor film is heated at 500 to 550° C. for 2 to 20 hours. In this case, the temperature is preferably set in a range of 500 to 550° C. in stages such that the temperature is gradually increased. By an initial low-temperature heating step, hydrogen and the like included in the amorphous semiconductor film is released, reducing roughness of the film caused by crystallization. That is, dehydrogenation can be carried out. A metal element for promoting the crystallization such as Ni is preferably formed on the amorphous semiconductor film so as to reduce the heating temperature. When carrying out the crystallization using such the metal element for promoting the crystallization, the amorphous semiconductor film may be heated at 600 to 950° C.

The gate insulating film 807 is formed to cover the semiconductor films 806. The gate insulating film 807 can be, for example, formed by using a single layer or a laminated layer including plural films of silicon oxide, silicon nitride, silicon nitride oxide, and the like.

The gate electrodes 808 are formed on the gate insulating film 807. The gate electrodes 808 can be, for example, formed using an element selected from Ta, W, Ti, Mo, Al, Cu, Cr and Nd, or a metal material or a compound material mainly including the above element. Alternatively, a semiconductor film typified by a polycrystalline semiconductor film into which an impurity element such as phosphorus is doped may be used to form the gate electrodes. Also, an AgPdCu alloy may be used. In addition, the combination of substances for the alloy may be arbitrarily selected. The gate electrodes 808 may be formed to have a singe layer or a laminated structure including plural layers. In this embodiment mode, the gate electrodes 803 are formed using a laminated structure of tantalum nitride (TaN) and tungsten (W).

Next, an impurity element imparting an n-type conductivity and an impurity element imparting a p-type conductivity are selectively added to the semiconductor films 806 while utilizing the gate electrodes 808 as masks or resist masks that are formed into a desired shape. The TFTs comprising the semiconductor films 806, the channel formation regions and the impurity regions (including the source regions, the drain regions, and the LDD regions) can be classified into the n-channel TFTs 820 and the p-channel TFTs 821 depending on the conductivity types of the impurity elements that are added to the semiconductor films.

As shown in FIGS. 9B and 9C, in each n-channel TFT 820, a sidewall is provided at the side of the gate electrode 808, and the source region, the drain region and the LDD region where are selectively added with the impurity element imparting the n-type conductivity are formed in the semiconductor film 806. Meanwhile, in each p-channel TFT 821, the source region and the drain region where are selectively added with the impurity element imparting the p-type conductivity are formed in the semiconductor film 806. The structure in that the side wall is provided at the side of the gate electrode 808 and the LDD region is selectively formed in each n-channel TFT 820 is shown here. However, the present embodiment mode is not limited to this structure. The LDD regions may also be formed in the p-channel TFTs 821. Alternatively, the side walls may not be provided in the p-channel TFTs 821.

Next, the interlayer insulating film 809 is formed. As the interlayer insulating film 809, an inorganic insulating film or an organic insulating film can be used. As the inorganic insulating film, a silicon oxide film or a silicon oxynitride film formed by CVD, a silicon oxide film formed by applying a liquid by an SOG (spin on glass) technology, or the like can be used. As the organic insulating film, a film formed using polyimide, polyamide, BCB (benzocyclobutene), acrylic, positive photosensitive organic region, negative photosensitive organic region, and the like can be employed. Also, a laminated structure of an acrylic film and a silicon oxynitride film may be used.

Further, the interlayer insulating film 809 may be formed using a siloxane material such as siloxane resin. The siloxane resin corresponds to a material containing Si—O—Si bonds. The siloxane includes skeleton that is formed with bonds of silicon (Si) and oxygen (O). As a substituent of the siloxane, an organic group that includes at least hydrogen (for example, alkyl group or aromatic hydrocarbon) is used. Also, a fluoro group may be used as its substituent. Further, the organic group including at least hydrogen and the fluoro group may be used as its substituents. Alternatively, the interlayer insulating film 809 may be formed using a material that contains polymer (polysilazane) having Si—N bonds.

By using the above materials, an interlayer insulating film having sufficient insulating property along with a planar surface can be obtained even when the thickness thereof is thinned. Also, since the above materials have excellent heat resistance properties, an interlayer insulating film that can withstand a reflow treatment in a multilayer Wiring can be obtained by employing the materials. In addition, since the above materials has low hygroscopic properties, an interlayer insulating film having a small amount of dehydration can be formed.

Next, the interlayer insulating film 809 is etched to form contact holes that reach the impurity regions of the semiconductor films 806. The wirings 810 that are electrically connected to the impurity regions are formed in the contact holes. The wirings 810 can be formed using a single layer or a laminated structure including an element selected from Al, Ni, C, W, Mo, Ti, Pt, Cu, Ta, Au and Mn or an alloy containing the plural elements. The wirings 810 are preferably formed using a metal film containing Al, here. In this embodiment mode, the wirings are formed using a laminated layer including a Ti film and an alloy film that contains Al and Ti. Of course, the wirings are not limited to the two layered structure, and they may include a singe layer structure or a laminated structure having three or more layers. The materials for the wirings are not limited to the laminated film of Al and Ti. For example, a laminated film in that an Al film or a Cu film is formed on a TiN film and a Ti film is laminated thereon may be formed.

Further, an insulating film 811 is preferably formed to cover the wirings 810. The wirings 810 of the element formation layers 802 will be partly connected to antennas later. However, there is concern that the wirings 810 are contaminated or deteriorated until the step of partly connecting the wirings to the antennas. Therefore, the insulating film 811 is preferably formed on the wirings 810. The insulating film 811 can be formed using a singe layer structure or a laminated layer structure of an insulating film containing oxygen or nitrogen, such as silicon oxide (SiOx), silicon nitride (SiNx), silicon oxynitride (SiOxNy) (x>y), and silicon nitride oxide (SiNxOy) x>y).

Afterwards, grooves 815 are formed between the adjacent element formation layers 802. The grooves can be formed by dicing, scribing, etching using a mask, or the like. When employing the dicing, a blade dicing technique that utilizes a dicing apparatus (or a dicer) is generally used. The blade is a whetstone in that diamond abrasive grains are embedded and the width of the blade is about 30 to 50 µm. By rapidly spinning this blade, the grooves are formed between the adjacent element formation layers 802. When employing the scribing, there are a diamond scribing technique and a laser scribing technique. Further, when employing the etching, mask patterns are formed through exposure and development steps, and then the grooves can be formed between the adjacent element formation layers 802 by dry etching or wet etching while utilizing the mask patterns. In the case of the dry etching, an atmospheric plasma method may be used. The grooves are formed between the adjacent element formation layers 802 in such a manner.

Further, the grooves are not necessary to be formed between the adjacent element formation layers. Alternatively, a groove may be formed at an interval of plural element formation layers. Furthermore, a groove may be formed in a portion where the thin film transistor of the element formation layer is not provided.

Figure 10A:
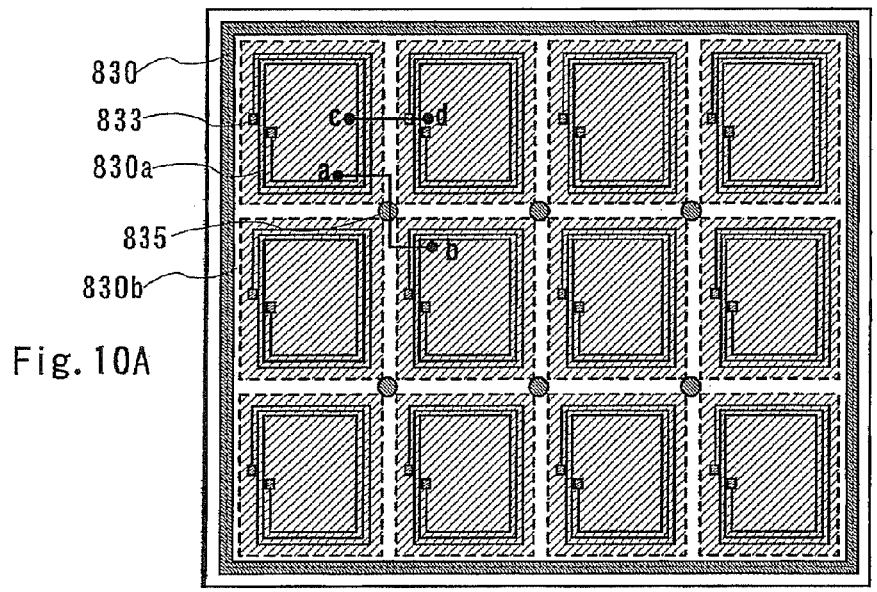
FIG. 10A is a top view and FIGS. 10B and 10C are cross sectional views showing a method for manufacturing a semiconductor device of the invention.
Figure 10B:
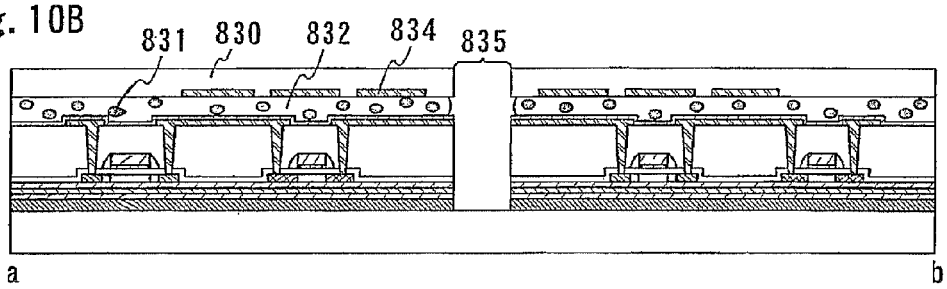
Figure 10C:
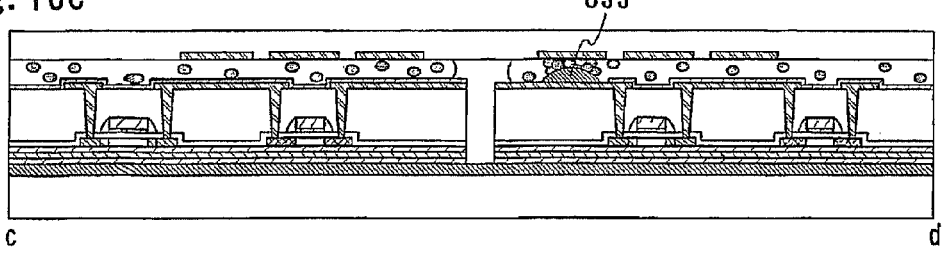

Next, as shown in FIGS. 10A to 10C, an antenna substrate 830 including conductive bodies 830a and a base film 830b is attached to the element formation layers 802. FIG. 10A is a top view showing the element formation layers attached with the antenna substrate 830, FIG. 10B is a cross sectional view along a line a-b of FIG. 10A, and FIG. 10C is a cross sectional view along a line c-d of FIG. 10A.

The antenna substrate 830 is attached to the element formation layers 802 by using, for example, an anisotropic conductive material 832 in that conductive materials 831 are dispersed. In the anisotropic conductive material 832, the conductive materials 831 are aggregated due to the thickness of each connection terminal 833 in a region where the connection terminal 833 is provided in the element formation layer 802. Therefore, the antenna substrate 830 can be electrically connected to the element formation layers 802 by the aggregated conductive materials. Meanwhile, the conductive materials 831 are dispersed while keeping enough distance therebetween except in the regions where the connection terminals are provided, and therefore, the antenna substrate is not electrically connected to the element formation layers other than in the regions where the connection terminals are provided. Alternatively, the antenna substrate may be attached to the element formation layers 802 by utilizing conductive adhesive, ultraviolet curing resin, a two-sided tape, or the like.

Conductive bodies 834 are further provided on the antenna substrate 830 at portions corresponding to the element formation layers 802. Also, openings 835 are provided in portions corresponding to the grooves 815. Further, the openings 835 may be provided between the adjacent conductive bodies 834, respectively. Alternatively, an opening may be formed at an interval of plural antennas. The case where the openings 835 have a circular shape is shown in FIG. 10A, however, the present invention is not limited thereto. For example, the openings may be provided to have a slit-like shape. As set forth above, the shape or the arrangement of the grooves 815 and the openings 835 can be arbitrarily determined.

Figure 11A:
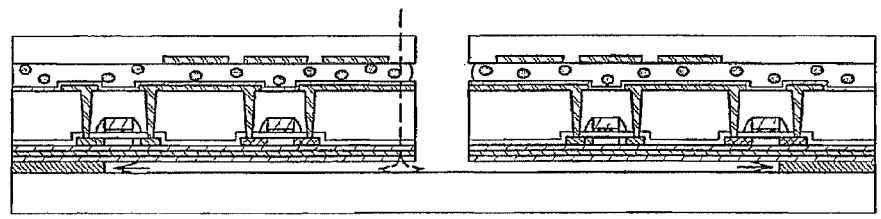
FIGS. 11A to 11D are cross sectional views showing a method for manufacturing a semiconductor device of the invention.

Next, an etching agent is introduced into the openings 835 to remove the separation layer 801 (FIG. 11A). In this case, the etching agent chemically reacts with the separation layer 801 so that the separation layer 801 is removed. The separation layer 801 may be removed completely. However, the separation layer 801 is not completely removed here and at least a part of the separation layer underlying the element formation layers 802 is remained. This allows to prevent the element formation layers 802 from being entirely separated from the substrate 800 after removing the separation layer 801.

As the etching agent, a gas or a liquid containing halogen fluoride (an interhalogen compound) that easily reacts with the separation layer 801 is preferably used. For example, when using a W film as the separation layer 801, gaseous chlorine trifluoride (ClF$_3$) that well reacts with W is preferably used. In addition, CF$_4$, SF$_6$, NF$_3$, F$_2$ and the like can be used as the etching agent. The etching agent can be arbitrarily selected by an operator.

Figure 11B:
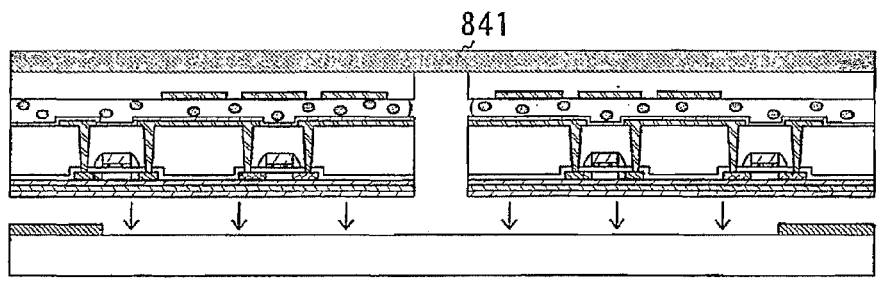

Next, one surface of the antenna substrate 830 attached with the element formation layers 802 is adhered to a first sheet material 841, and then the element formation layers 802 are separated from the substrate 800 (FIG. 11B). Further, since the element formation layers 802 are partly connected to the substrate 800 by a part of the remaining separation layer 801, the element formation layers 802 are physically separated from the substrate 800.

A substrate or a film having an adhesive layer at least on one side can be used as the first sheet material 841. A flexible film of which one surface is pasted with adhesive is used here. Concretely, a film made from polyester or the like on which adhesive with a weak adhesion that contains acrylic resin or the like is provided is used.

Figure 11C:
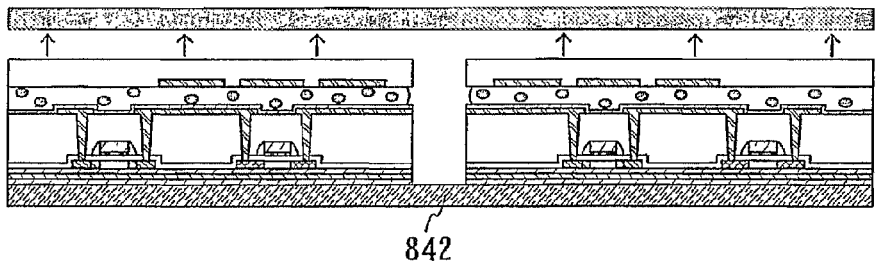
Figure 11D:
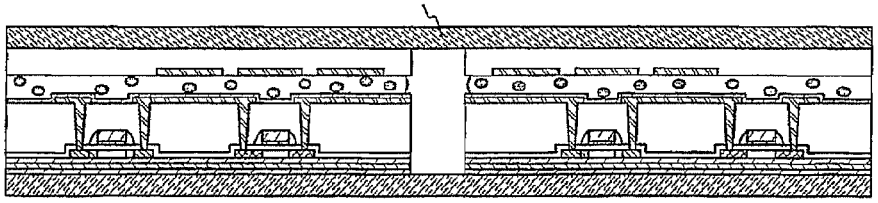

Next, a second sheet material 842 is adhered to the surfaces of the element formation layers 802 that are separated from the substrate 800 and the element formation layers 802 and the antenna substrate 830 are separated from the first sheet material (FIG. 11C). Subsequently, a third sheet material 843 is adhered to the surface of the antenna substrate 830, which is separated from the first sheet material, so as to seal the element formation layers 802 and the antenna substrate 830 with the first sheet material 842 and the third sheet material 843 (FIG. 11D).

As the second and third sheet materials 842 and 843, laminate films can be used. A film made from polyester or the like on which a hot-melt film is provided can be utilized here. When adhering the second sheet material 842 to the element formation layers 802 or adhering the third sheet material 843 to the antenna substrates 830 while carrying out one or both of a pressing treatment and a heat treatment, it can be adhered thereto efficiently. In addition, the second and third sheet materials are preferably coated with films made from silicon oxide (SiOx), silicon nitride (SiNx), silicon oxynitride (SiOxNy) (x>y), or silicon nitride oxide (x>y) in advance so as not to intrude moisture and the like from penetrating into the element formation layers through the second and third sheet materials.

Furthermore, films that are subjected to an antistatic treatment for preventing static charge (hereinafter, referred to as antistatic films) can be used as the second and third sheet materials 842 and 843. A film in that an antistatic material is dispersed in resin, a film to which an antistatic material is attached, and the like can be given as the antistatic films. With respect to a film to which an antistatic material is attached, the antistatic material may be provided to one surface of the film, or the antistatic material may be provided to both surfaces of the film. Further, the film having an antistatic material on one side may be adhered to the element formation layers or the antenna substrate such that the antistatic material is in contact with the element formation layers or the antenna substrate, or, the other surface of the film is in contact with the element formation layers or the antenna substrate. Furthermore, the antistatic material may be provided on an entire surface of the film, or a part of the film. As the antistatic material, metal, indium tin oxide (ITO), surfactant such as ampholytic surfactant, cationic surfactant and nonionic surfactant, or the like can be used. In addition, a resin material containing cross-linked copolymer that has a carboxyl group and a quaternary ammonium group in side chains, and the like can be used as the antistatic material. By attaching or applying these materials to a film, or by kneading them in a film, the film can be used as an antistatic film. By sealing the element formation layers with the antistatic films, semiconductor elements can be prevented from being adversely affected by static charge and the like from an external portion when dealing the semiconductor devices as products.

Afterwards, the second sheet material 842 and the third sheet material 843 provided between the adjacent element formation layers 802 are selectively cut off by dicing, scribing, laser cutting or the like. Thus, the semiconductor devices sealed with the sheet materials can be completed.

Furthermore, a sheet material having lower adhesion than the second and third sheet materials 842 and 843 is used as the first sheet material 841 in this embodiment mode. This is because when a sheet material with high adhesion is used as the first sheet material 841 in separating the element formation layers 802 from the substrate 800, the substrate 800 is difficult to be separated from the element formation layers by utilizing this sheet material. In this embodiment mode, the separation steps are carried out two times to provide the element formation layers 802 on a flexible substrate.

In the case where the element formation layers 802 are formed over a glass substrate, there is no constraint in a shape of a mother substrate as compared with a case of using a substrate made from silicon. Accordingly, utilization of the glass substrate can improve the productivity, making it possible to perform mass-production. In the above process, the substrate separated from the element formation layers can be reused so that the manufacturing cost can be reduced. For example, a quartz substrate has advantages of a planar surface, a high heat resistance property, and the like; however, the quartz substrate has a disadvantage of being expensive. However, by reusing the substrate, the manufacturing cost can be reduced even when using the quartz substrate that is more expensive than a glass substrate.

Moreover, the present embodiment mode can be freely combined with the above embodiment modes.

[Embodiment Mode 6]

A case of separating and sealing a semiconductor device provided over a substrate by utilizing a laminating apparatus will be described in Embodiment Mode 6 with reference to the drawings. One example where a semiconductor device provided over a substrate with rigidity such as glass is separated from the substrate and is sealed with flexible films will be shown here. Schematic views thereof are depicted in FIGS. 12A and 12B. FIG. 12A shows steps of manufacturing the semiconductor device whereas FIG. 12B shows the structures of the semiconductor device in each step.

The laminating apparatus shown in this embodiment mode comprises: conveying means 870 for conveying a substrate 800 over which an element formation layer 802 and an antenna substrate 830 are provided; a first sheet material 861 having an adhesive layer at least on one side of the first sheet material; and a second sheet material 862 and a third sheet material 863 for sealing the element formation layer 802 and the antenna substrate 830. This laminating apparatus also comprises first separating means 871 for separating the element formation layer 802 and the antenna substrate 830 from the substrate 800; second separating means 872 for separating the element formation layer 802 and the antenna substrate 830 from the first sheet material 861; sealing means 873 for sealing the element formation layer 802 and the antenna substrate 830; and the like. Further, all of these component parts may be provided, or some component parts may be combined to be used. The overall flow will be described below.

The element formation layer 802 provided over the substrate 800 is conveyed by the conveying means 870. The element formation layer 802 is conveyed toward the first separating means 871.

Next, the first sheet material 861 is adhered to a surface of the antenna substrate 830 by the first separating means 871 that comprises a roller, and then the element formation layer 802 and the antenna substrate 830 are separated from the substrate 800. Thereafter, the element formation layer 802 and the antenna substrate 830 separated from the substrate are conveyed toward the second separating means 872 while being adhered with the first sheet material 861.

Next, the second sheet material 862 is adhered to a surface of the element formation layer 802 by using the second separating means 872 that comprises rollers, and then the element formation layer 802 and the antenna substrate 830 are separated from the first sheet material 861. Preferably, one or both of a pressing treatment and a heat treatment is/are carried out at this time. Thereafter, the element formation layer 802 and the antenna substrate 830, which are separated from the first sheet material, are conveyed toward the sealing means 873 while being adhered with the second sheet material 862.

Subsequently, the third sheet material 863 is adhered to the surface of the antenna substrate 830 by using the sealing means 873 so that the element formation layer 802 and the antenna substrate 830 are sealed with the second and third sheet materials 862 and 863. In the sealing means 873, one or both of a pressing treatment and a heat treatment is/are carried out while attaching the third sheet material 863 to the surface of the antenna substrate and sandwiching the element formation layer 802 and the antenna substrate 830 with the second and third sheet materials.

The conveying means 870 conveys the substrate 800 over which the element formation layer 802 is provided, and may includes any structure so long as it can convey the substrate 800. For example, a belt conveyor, plural rollers, plural robot arms, and the like can be employed. The robot arms convey the substrate 800 or a stage on that the substrate 800 is placed.

The first sheet material 861 is formed using a flexible film. The first sheet material 861 has adhesive at least on one side. Concretely, the adhesive is attached to a base film that is formed using polyester or the like and used as a base material. As the adhesive, a resin material containing acrylic resin or the like or a material made from synthetic resin can be used. A film with weak adhesion (the adhesion is preferably 0.01 to 1.0 N, and more preferably 0.05 to 0.5 N) is preferably used as the first sheet material 861. This is because after adhering the first sheet material to the element formation layer provided over the substrate, the first sheet material is separated from the element formation layer and then the second sheet material is adhered to the element formation layer. The thickness of the adhesive can be set to be 1 to 100 µm, and more preferably, 1 to 30 µm. Preferably, the base film is formed using a film made from polyester or the like with a thickness of 10 µm to 1 mm since this film is easily handled in processing.

The second and third sheet materials 862 and 863 are formed using flexible films that correspond to, for example, laminate films or papers formed using a fibrous material. The laminate films indicate general films that can be used for a laminating treatment and are formed using polypropylene, polystyrene, polyester, vinyl, polyvinyl fluoride, vinyl chloride, methyl methacrylate, nylon, polycarbonate, and the like. The surface of the laminate film may be subjected to an embossing treatment or the like.

In addition, the element formation layer is preferably sealed using a hot-melt adhesive in this embodiment mode. The hot-melt adhesive is formed using a nonvolatile thermoplastic material that contains no water or solution, and remains in a solid state at room temperature. The hot-melt adhesive is a chemical substance that attach objects together by applying the chemical substance in a dissolved state and cooling it. Further, the hot-melt adhesive has advantages of short adhesion time and being pollution-free, safe, hygienic, energy-saving, and low-cost.

Since the hot-melt adhesive remains in the solid state at normal temperature, the hot-melt adhesive that has been processed into a film form or a fiber form in advance can be used. Alternatively, an adhesive layer that is formed on a base film made from polyester or the like in advance and then is processed into a film form can be used. A sheet material in that a hot-melt film is formed on a base film made from polyethylene terephthalate is used here. The hot-melt film is formed using resin with a softening point that is lower than that of the base film. By performing a heat treatment, only the hot-melt film is dissolved and becomes a rubbery state so that the dissolved hot-melt film is attached to an object. When cooling the hot-melt film, it is cured. As the hot-melt film, for example, a film mainly including ethylene-vinyl acetate copolymer (EVA), polyester, polyamide, thermoplastic elastomer, polyolefin, or the like can be used. Preferably, the second and third sheet materials are coated with films formed using silicon oxide (SiOx), silicon nitride (SiNx), silicon oxynitride (SiOxNy) (x>y), silicon nitride oxide (SiNxOy) (x>y), or the like so as to prevent moisture and the like from penetrating into the element formation layer through these sheet materials.

As shown in FIGS. 12A and 12B, the above-mentioned separating steps and sealing step can be successively carried out by utilizing the laminating apparatus, and hence, the separating treatment and the sealing treatment can be carried out efficiently.

Moreover, the present embodiment mode can be implemented by being freely combined with the above embodiment modes.

[Embodiment Mode 7]

A case of using the above-described semiconductor device, which comprises an antenna, as a wireless chip will be described in Embodiment Mode 7 with reference to FIGS. 13A and 13B.

A wireless chip shown in this embodiment mode includes an element formation layer 920, an antenna 921, a substrate 922, and a cover material 923. The element formation layer 920 and the antenna 921 are sandwiched between the substrate 922 and the cover material 923. The antenna 921 is electrically connected to the element formation layer 920 (FIG. 13A).

Figure 13A:
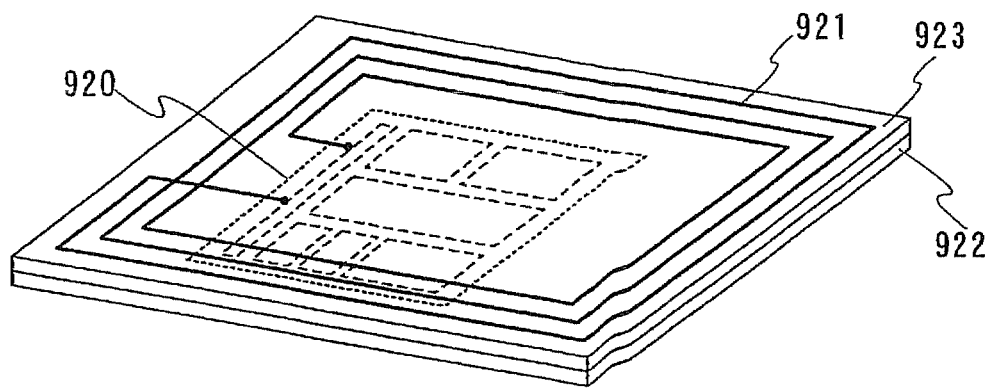
Figure 13B:
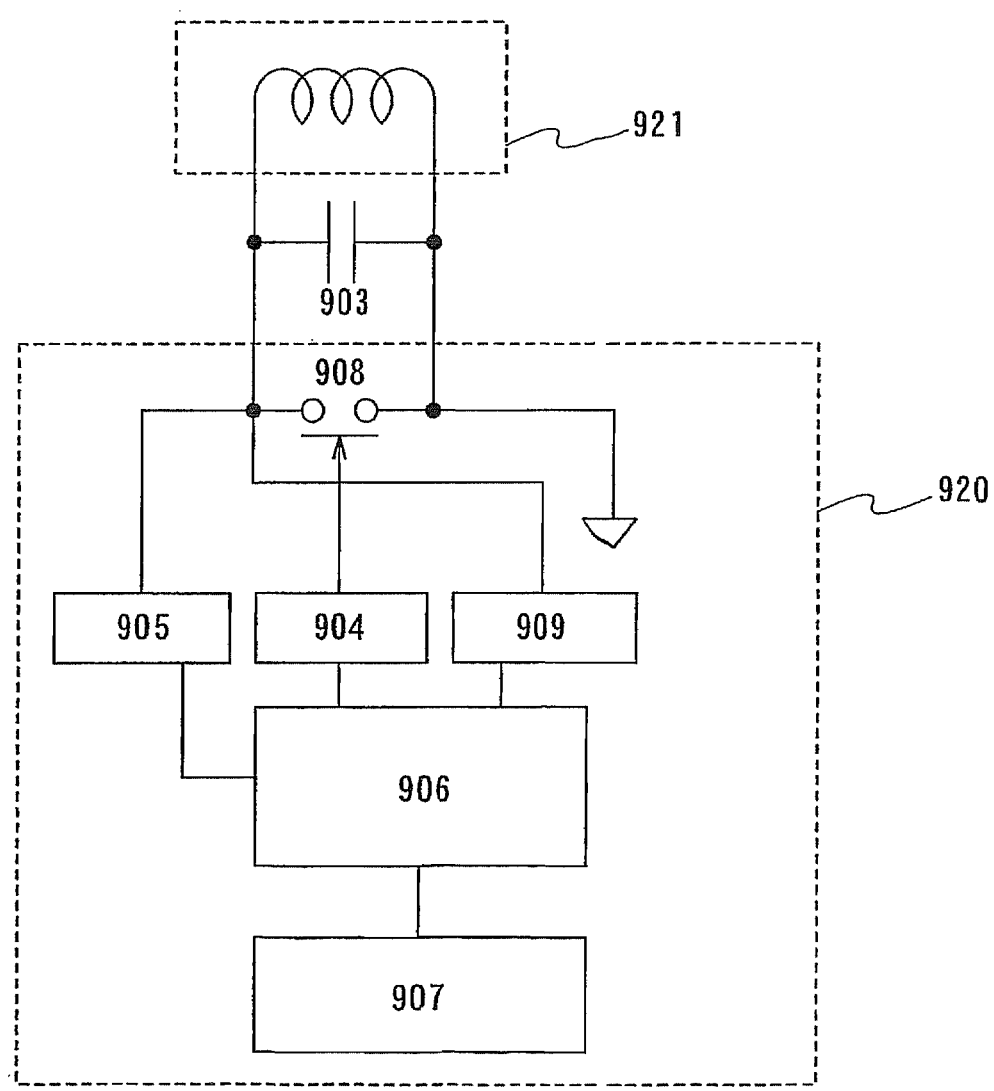

FIG. 13B shows a block diagram of an example of a functional structure of the wireless chip as shown in FIG. 13A.

In FIG. 13B, the element formation layer 920 includes a demodulation circuit 909, a modulation circuit 904, a rectification circuit 905, a microprocessor 906, a memory 907 and a switch 908 for applying load modulation to the antenna 921. The antenna 921 is electrically connected to the element formation layer 920, and a capacitor 903 is provided between both terminals of the antenna 921. Plural memories may be employed instead of using one memory 907. An SRAM, a flash memory, a ROM, an FeRAM and the like can be used.

Signals sent from a reader/writer as radio waves are modulated into alternating-current electric signals in the antenna 921 by electromagnetic induction. The alternating-current electric signals are demodulated in the demodulation circuit 909 and the demodulated signals are transmitted to the subsequent stage microprocessor 906. A supply voltage is generated in the rectification circuit 905 by utilizing the alternating-current electric signals and the supply voltage is supplied to the subsequent stage microprocessor 906. In the microprocessor 906, various kinds of arithmetic processings are performed in accordance with the input signals. Programs, data and the like that are used in the microprocessor 906 are stored in the memory 907. In addition, the memory 907 can also be used as a work area in the arithmetic processings.

When the data is sent to the modulation circuit 904 from the microprocessor 906, the modulator circuit 904 can control the switch 908 and add load modulation to the antenna 921 in accordance with the data. The reader/writer receives load modulation applied to the antenna 921 via radio waves so that the reader/writer can read the data sent from the microprocessor 906.

Further, the wireless chip is not necessary to have the microprocessor 906. Also, a method for transmitting signals is not limited to the electromagnetic coupling method as shown in FIG. 13B. Alternatively, an electromagnetic induction method, a microwave method, or other transmitting method may be employed. Furthermore, the wireless chip can employ either a passive type in that the supply voltage is supplied to the element formation layer via radio waves without having a power source (a buttery), or an active type in that the supply voltage is supplied to the element formation layer by utilizing a power source (a buttery) instead of the antenna. Alternatively, the supply voltage may be supplied to the element formation layer by utilizing the radio waves and power source.

Thus, the wireless chip has various advantages, wherein non-contact communication is performed, plural pieces of data can be read, data can be written in the wireless chip, the wireless chip can be processed into various shapes, and the wireless chip has a wide directional characteristic and a wide recognition range depending on a frequency to be selected. The wireless chip can be applied to an IC tag that can recognize individual information about a person and goods by non-contact radio communication., a label that can be attached to an object by performing a labeling treatment, a wristband for an event or an amusement, or the like. Also, the wireless chip may be processed by using a resin material. Alternatively, the wireless chip may be directly fixed to metal that hinder wireless communication. Moreover, the wireless chip can be utilized for system administration such as a room security management system and an account system.

Figure 14A:
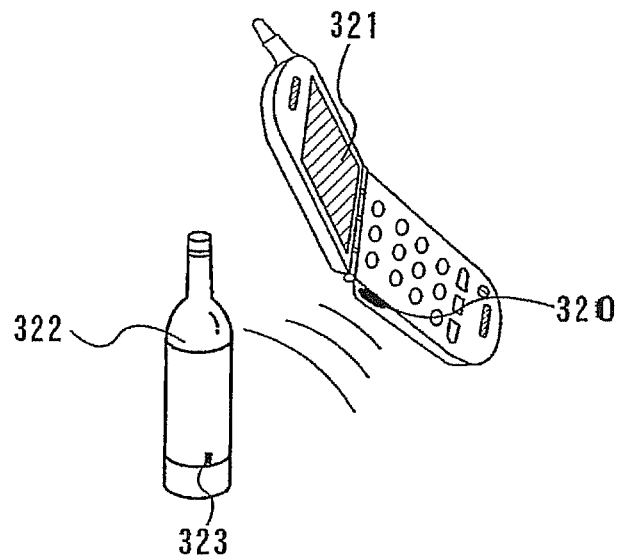
FIGS. 14A and 14B are diagrams showing products on which semiconductor devices of the invention are mounted.
Figure 14B:
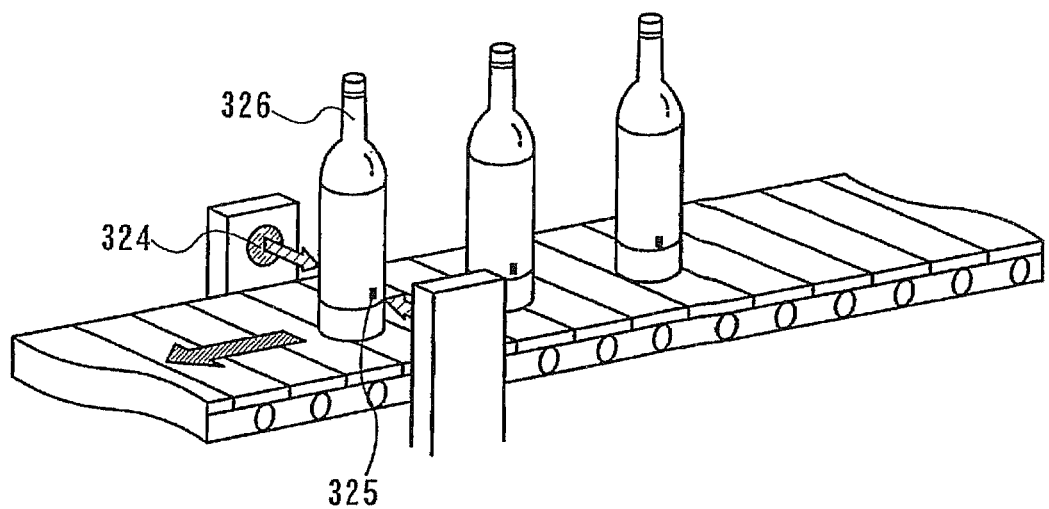

Next, an example of actually using the above described wireless chip will be described. A reader/writer 320 is provided on the side of a portable terminal that includes a display portion 321. A wireless chip 323 is provided on the side of a product 322 (FIG. 14A). When holding the reader/writer 320 over the wireless chip 323 attached to the product 322, information about a raw material, a place of origin, test results in each production process, history of distribution process, a description of a commodity are displayed on the display portion. In addition, when conveying a commodity 326 by a belt conveyor, the inspection of the commodity 326 can be carried out by utilizing a reader/writer 324 and a wireless chip 325 provided on the commodity 326 (FIG. 14B). In this way, by utilizing the wireless chips for a system, information can be easily obtained, thereby realizing high performance and high added value.

Accordingly, the semiconductor device provided with the antenna can sent and receive information from an external portion, and hence, the semiconductor device can be utilized as a wireless memory or a wireless processor.

Further, the present invention can be implemented by being freely combined with the above embodiment modes.

[Embodiment Mode 8]

Figure 16A:
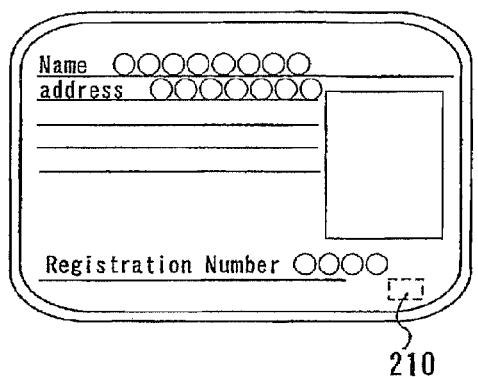
FIGS. 16A to 16E are diagrams showing products on which semiconductor devices according to the invention are mounted.
Figure 16B:
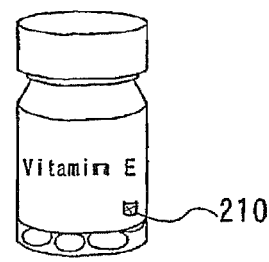
Figure 16C:
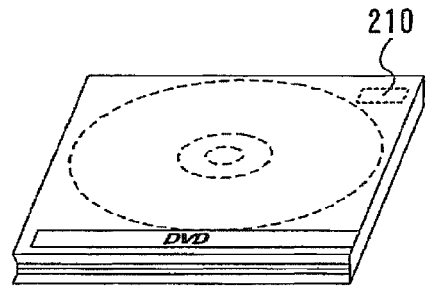
Figure 16D:
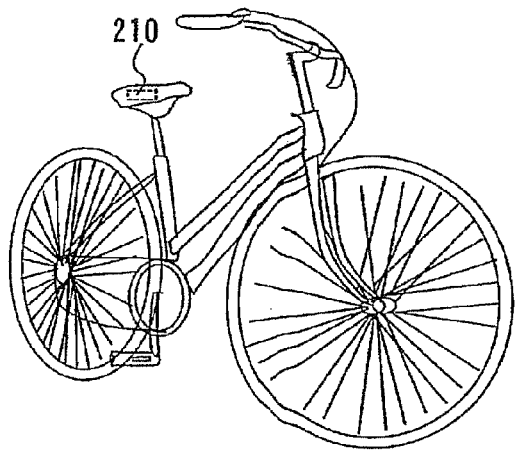
Figure 16E:
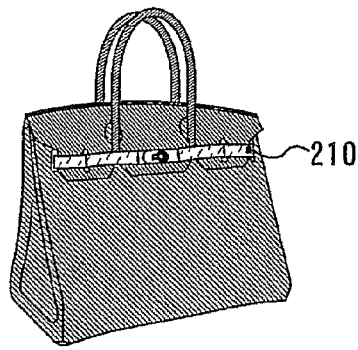

Embodiment Mode 8 will describe use applications of the above described semiconductor device including the antenna that is used as a wireless chip. Wireless chips can be, for example, used by being attached with bills, coins, portfolios, bearer bonds, certificates (such as a driver's certificate and a certificate of residence, FIG. 16A), wrapping containers (such as a wrapping paper and a bottle, FIG. 16B), recording mediums such as a DVD, a CD, and a video tape (FIG. 16C), vehicles such as a car and a motorcycle (FIG. 16D), belongings such as a bag and eye glasses (FIG. 16E), foods, clothes, livingwares, electronic appliances, and the like. The electronic appliances indicate a liquid crystal display device, an EL display device, a television device (also referred to as a television or a television receiver, simply), a cellular phone, and the like.

Further, the wireless chips can be fixed to goods by attaching the wireless chips to the surface of the goods or embedding the wireless chips in the goods. For example, the wireless chip may be embedded in a paper of a book, or embedded in organic resin of a package that is formed using the organic resin. By providing the wireless chips to bills, coins, portfolios, bearer bonds, certificates, and the like, forgery of these things can be prevented. In addition, by providing the wireless chips to wrapping containers, recording mediums, belongings, foods, clothes, livingwares, electronic appliances, and the like, an inspection system, a system of a rental shop can be improved efficiently. Additionally, by providing the wireless chips to vehicles, the forgery and the theft can be prevented. By embedding the wireless chips in creatures such as animals, individual creatures can be identified easily. For example, by embedding a wireless tag in a creature such as livestock, a birth data, sexuality, breed, and the like can be easily identified.

As set forth above, the semiconductor devices according to the present invention can be provided to various kinds of goods (including creatures). Moreover, the present embodiment mode can be implemented by being freely combined with the above embodiment modes.

What is claimed is:

1. A semiconductor device comprising:
    an element formation layer over and in contact with a substrate, the element formation layer comprising a thin film transistor, an interlayer insulating film over the thin film transistor and a wiring over the interlayer insulating film;
    a connection terminal over and in contact with the wiring;
    an anisotropic conductive film over the element formation layer and the connection terminal, the anisotropic conductive film comprising a conductive material; and
    an antenna over the anisotropic conductive film,
    wherein the antenna includes a film and a conductive body,
    wherein the wiring and the conductive body are electrically connected to each other via the connection terminal and the conductive material,
    wherein a bottom surface of the film includes a depression formed by pressing a mold against the film,
    wherein the depression has a stepped shape in a cross section,
    wherein the conductive body is in the depression,
    wherein the film is in contact with the anisotropic conductive film, and
    wherein a bottom surface of the conductive body is flush with the bottom surface of the film.

2. The semiconductor device according to claim 1, wherein the substrate is a flexible substrate.

3. A semiconductor device comprising:
    an element formation layer over and in contact with a substrate, the element formation layer comprising a thin film transistor, an interlayer insulating film over the thin film transistor and a wiring over the interlayer insulating film;
    a connection terminal over and in contact with the wiring;
    an anisotropic conductive film over the element formation layer and the connection terminal, the anisotropic conductive film comprising a conductive material; and
    an antenna over the anisotropic conductive film,
    wherein the antenna includes a film and a conductive body,
    wherein the wiring and the conductive body are electrically connected to each other via the connection terminal and the conductive material,
    wherein a surface of the film includes a depression formed by pressing a mold against the film,
    wherein the depression has a stepped shape in a cross section,
    wherein the conductive body is in the depression, and
    wherein the film is in contact with the anisotropic conductive film.

4. The semiconductor device according to claim 3, wherein the substrate is a flexible substrate.

5. A semiconductor device comprising:
    an element formation layer over a substrate, the element formation layer comprising a transistor, an interlayer insulating film over the transistor and a wiring over the interlayer insulating film;
    a connection terminal over and in contact with the wiring;
    an anisotropic conductive film over the element formation layer and the connection terminal, the anisotropic conductive film comprising a conductive material; and
    an antenna over the anisotropic conductive film,
    wherein the antenna includes a film and a conductive body, wherein the wiring and the conductive body are electrically connected to each other via the connection terminal and the conductive material, wherein the film includes a depression, wherein the depression has a stepped shape in a cross section, wherein the conductive body is in the depression, and wherein the film is in contact with the anisotropic conductive film.

6. The semiconductor device according to claim 5, wherein the substrate is a flexible substrate.

* * * * *